United States Patent
Kitayama et al.

(10) Patent No.: US 10,950,465 B2
(45) Date of Patent: Mar. 16, 2021

(54) METHOD OF CLEANING SUBSTRATE PROCESSING APPARATUS AND SYSTEM OF CLEANING SUBSTRATE PROCESSING APPARATUS

(71) Applicant: Tokyo Electron Limited, Tokyo (JP)

(72) Inventors: Shotaro Kitayama, Kumamoto (JP); Gentaro Goshi, Kumamoto (JP); Hiroki Ohno, Kumamoto (JP); Keisuke Egashira, Kumamoto (JP); Yosuke Kawabuchi, Kumamoto (JP); Hiroshi Marumoto, Kumamoto (JP); Takuro Masuzumi, Kumamoto (JP); Kento Tsukano, Kumamoto (JP); Hiromi Kiyose, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 3 days.

(21) Appl. No.: 15/826,074

(22) Filed: Nov. 29, 2017

(65) Prior Publication Data

US 2018/0158699 A1 Jun. 7, 2018

(30) Foreign Application Priority Data

Dec. 2, 2016 (JP) .............................. JP2016-235342

(51) Int. Cl.
*H01L 21/67* (2006.01)
*B08B 3/08* (2006.01)
*B08B 5/00* (2006.01)
*F26B 5/00* (2006.01)
*B08B 9/00* (2006.01)
(Continued)

(52) U.S. Cl.
CPC .......... *H01L 21/67034* (2013.01); *B08B 5/00* (2013.01); *B08B 9/00* (2013.01);
(Continued)

(58) Field of Classification Search
CPC . B08B 15/007; B08B 2203/0229; B08B 3/08; B08B 5/00; B08B 9/00; C11D 7/261; F26B 5/005; H01L 21/67034
(Continued)

(56) References Cited

U.S. PATENT DOCUMENTS 5,494,526 A * 2/1996 Paranjpe ........... H01L 21/02046
134/1
6,161,300 A * 12/2000 Kim .................. H01L 21/67034
34/73
(Continued)

FOREIGN PATENT DOCUMENTS

JP H09-289187 A 11/1997
JP 2002-246361 A 8/2002
(Continued)

*Primary Examiner* — Binh X Tran
*Assistant Examiner* — Christopher Remavege
(74) *Attorney, Agent, or Firm* — Abelman, Frayne & Schwab

(57) ABSTRACT

Disclosed is a method of cleaning a substrate processing apparatus in which a substrate having a surface wet by a liquid is brought into contact with a supercritical fluid so as to perform a drying process of drying the substrate. The method includes a cleaning gas filling process and an exhausting process. The cleaning gas filling process fills a cleaning gas containing isopropyl alcohol in the substrate processing apparatus. The exhausting process exhausts the cleaning gas from an inside of the substrate processing apparatus after the cleaning gas filling process.

7 Claims, 14 Drawing Sheets

(51) Int. Cl.
*C11D 11/00* (2006.01)
*C11D 7/26* (2006.01)
*B08B 15/00* (2006.01)

(52) U.S. Cl.
CPC .......... *C11D 7/261* (2013.01); *C11D 11/0041* (2013.01); *F26B 5/005* (2013.01); *B08B 3/08* (2013.01); *B08B 15/007* (2013.01); *B08B 2203/0229* (2013.01)

(58) Field of Classification Search
USPC ..... 134/26, 30, 31, 902, 21, 1, 18, 37, 95.2, 134/22.18
See application file for complete search history.

(56) References Cited

U.S. PATENT DOCUMENTS

| | | | | |
|---|---|---|---|---|
| 6,883,248 | B2* | 4/2005 | Ko | H01L 21/67034 34/78 |
| 7,507,297 | B2* | 3/2009 | Irie | B08B 7/0021 134/18 |
| 8,393,091 | B2* | 3/2013 | Kawamoto | H01L 21/02057 134/21 |
| 2011/0220152 | A1* | 9/2011 | Kitajima | F26B 3/00 134/26 |
| 2011/0240066 | A1* | 10/2011 | Kamikawa | H01L 21/67034 134/26 |
| 2011/0247662 | A1* | 10/2011 | Kamikawa | H01L 21/67034 134/105 |
| 2011/0289793 | A1* | 12/2011 | Hayashi | F26B 3/04 34/357 |
| 2012/0304485 | A1* | 12/2012 | Hayashi | H01L 21/02057 34/415 |
| 2013/0019905 | A1* | 1/2013 | Ji | F26B 23/028 |

FOREIGN PATENT DOCUMENTS

| | | |
|---|---|---|
| JP | 2011-249454 A | 12/2011 |
| JP | 2013-012538 A | 1/2013 |

* cited by examiner

METHOD OF CLEANING SUBSTRATE PROCESSING APPARATUS AND SYSTEM OF CLEANING SUBSTRATE PROCESSING APPARATUS

CROSS-REFERENCE TO RELATED APPLICATION

This application is based on and claims priority from Japanese Patent Application No. 2016-235342 filed on Dec. 2, 2016 with the Japan Patent Office, the disclosure of which is incorporated herein in its entirety by reference.

TECHNICAL FIELD

Exemplary embodiments disclosed herein relate to a method of cleaning a substrate processing apparatus and a system of cleaning the substrate processing apparatus.

BACKGROUND

In the related art, there has been known a method of drying a wafer, in which, in a drying process after a surface of, for example, a semiconductor wafer (hereinafter, referred to as a "wafer"), which is a substrate, is processed with a liquid, the wafer having a surface wet by a liquid is brought into contact with a supercritical fluid, thereby being dried (see, e.g., Japanese Patent Laid-Open Publication No. 2013-012538).

SUMMARY

A method of cleaning a substrate processing apparatus according to an aspect of an exemplary embodiment is a method of cleaning a substrate in which a substrate having a surface wet by a liquid is brought into contact with a supercritical fluid so as to perform a drying process of drying the substrate, and includes a cleaning gas filling process and an exhausting process. The cleaning gas filling process fills a cleaning gas containing isopropyl alcohol in the substrate processing apparatus. The exhausting process exhausts the cleaning gas from an inside of the substrate processing apparatus after the cleaning gas filling process.

The foregoing summary is illustrative only and is not intended to be in any way limiting. In addition to the illustrative aspects, embodiments, and features described above, further aspects, embodiments, and features will become apparent by reference to the accompanying drawings and the following detailed description.

DETAILED DESCRIPTION

Figure 1:
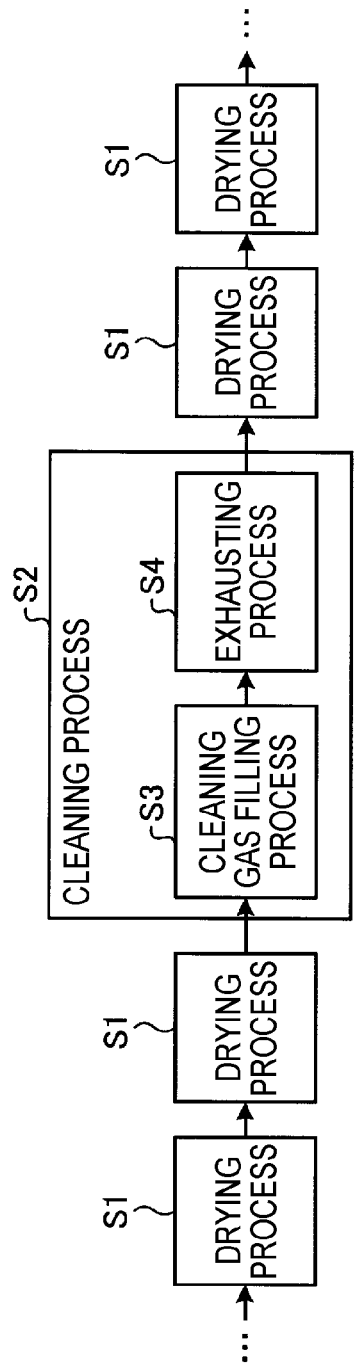
FIG. 1 is a view illustrating an outline of a cleaning process of a substrate processing system according to an exemplary embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In a drying method using a supercritical fluid in the related art, when multiple wafers are repeatedly dried, a large number of particles may adhere to the wafers. In addition, the yield of wafers may be lowered by the large number of adhering particles.

An aspect of the exemplary embodiment has been made in consideration of the foregoing situation, and provides a method of cleaning a substrate processing apparatus and a cleaning system for the substrate processing apparatus that may suppress adhesion of a large number of particles to a wafer when drying the wafer using a supercritical fluid.

A method of cleaning a substrate processing apparatus according to an aspect of an exemplary embodiment is a method of cleaning a substrate in which a substrate having a surface wet by a liquid is brought into contact with a supercritical fluid so as to perform a drying process of drying the substrate, and includes a cleaning gas filling process and an exhausting process. The cleaning gas filling process fills a cleaning gas containing isopropyl alcohol in the substrate processing apparatus. The exhausting process exhausts the cleaning gas from an inside of the substrate processing apparatus after the cleaning gas filling process.

In the above-described method, the liquid contains isopropyl alcohol.

In the above-described method, the cleaning gas filling process includes: a cleaning liquid carrying-in process of carrying a jig filled with a cleaning liquid containing isopropyl alcohol into the substrate processing apparatus; and a cleaning liquid vaporizing process of vaporizing the cleaning liquid in the inside of the substrate processing apparatus after the cleaning liquid carrying-in process.

In the above-described method, the jig includes a disk portion having a diameter and a thickness substantially equal to a diameter and a thickness of the substrate, and a ring-shaped portion protruding in a ring shape from a main surface of the disk portion.

In the above-described method, the cleaning gas filling process includes a cleaning gas introducing process of introducing the cleaning gas into the substrate processing apparatus through a predetermined introduction path.

In the above-described method, the cleaning gas filling process includes: a cleaning liquid introducing process of introducing the cleaning liquid containing isopropyl alcohol into the substrate processing apparatus through a predetermined introduction path; and a cleaning liquid vaporizing process of vaporizing the cleaning liquid in the substrate processing apparatus after the cleaning liquid introducing process.

In the above-described method, the supercritical fluid contains carbon dioxide.

A system of cleaning a substrate processing apparatus according to an aspect of another exemplary embodiment is a system of cleaning a substrate processing apparatus, in which a substrate having a surface wet by a liquid is brought into contact with a supercritical fluid so as to perform a drying process of drying the substrate, and includes a cleaning gas filling unit and an exhausting unit. The cleaning gas filling unit fills a cleaning gas containing isopropyl alcohol in the substrate processing apparatus, and the exhausting unit exhausts the cleaning gas from an inside of the substrate processing apparatus.

According to the aspects of the exemplary embodiments, when the wafer is dried using the supercritical fluid, a large number of particles may be suppressed from adhering to a wafer.

<Outline of Process of Cleaning Substrate Processing System>

First, an outline of a process of cleaning a substrate processing system 1 according to an exemplary embodiment will be described with reference to FIG. 1. FIG. 1 is a view illustrating an outline of the process of cleaning the substrate processing system 1 according to the exemplary embodiment.

Figure 2:
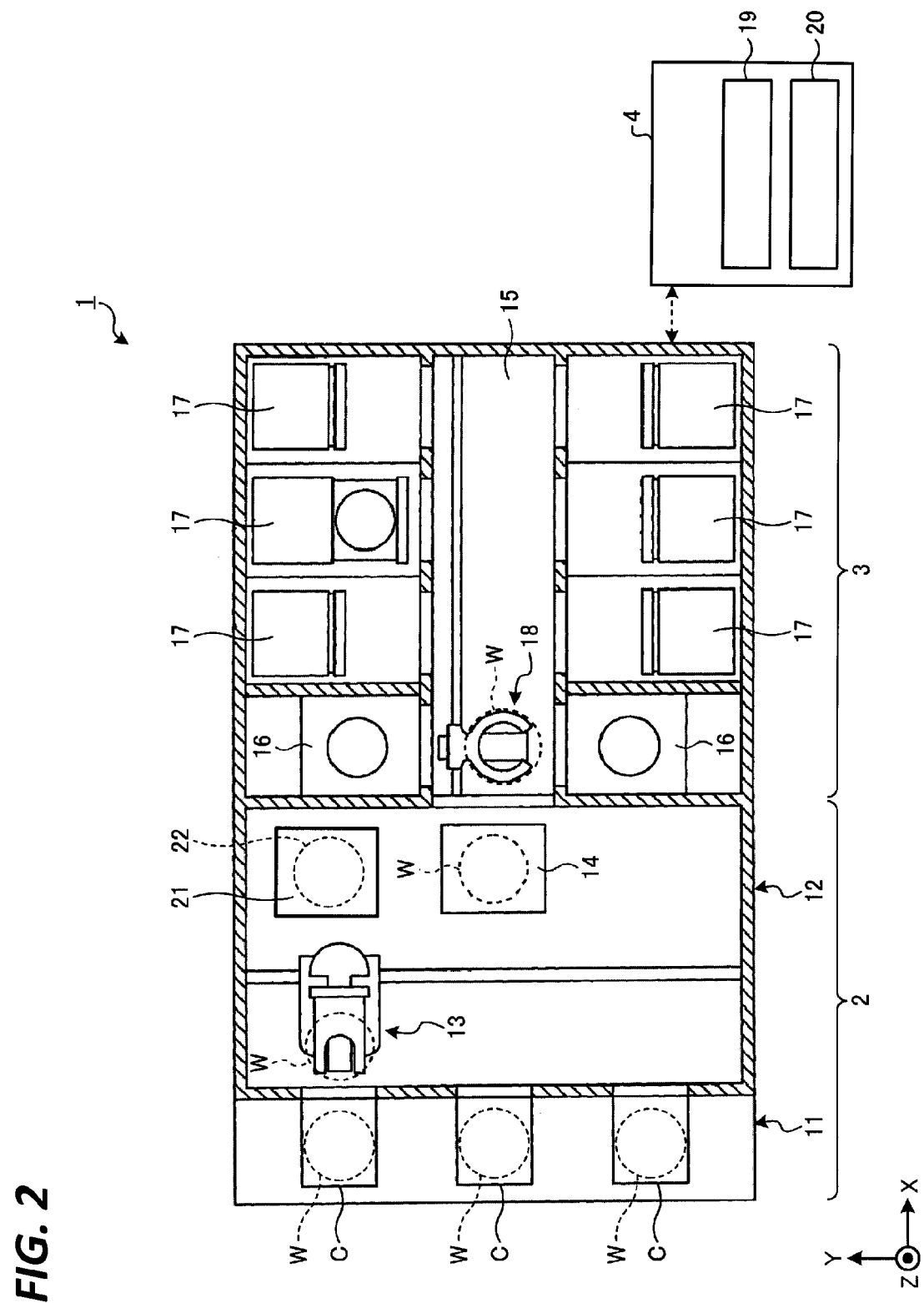
FIG. 2 is a schematic view illustrating a schematic configuration of the substrate processing system.

In the substrate processing system 1 (see, e.g., FIG. 2) according to the exemplary embodiment, as illustrated in FIG. 1, a drying process using a supercritical fluid (S1) is repeatedly performed for a plurality of wafers in a drying processing unit 17 (see, e.g., FIG. 2). The details of the drying process (S1) will be described later.

Here, in the process of cleaning the substrate processing system 1 according to the exemplary embodiment, a cleaning process (S2) is performed between the drying processes (S1) repeatedly performed in the drying processing unit 17 of the substrate processing system 1. This cleaning process (S2) includes a cleaning gas filling process (S3) and a cleaning gas exhausting process (S4).

In the cleaning gas filling process (S3), isopropyl alcohol (hereinafter, referred to as "IPA") is supplied into the drying processing unit 17, thereby filling IPA in a gaseous state (hereinafter, referred to as "IPA gas") inside the drying processing unit 17. Then, the filled IPA gas is filled in the drying processing unit 17 and adsorbs the particles that are floating and adhering in the drying processing unit 17.

In the subsequently performed exhausting process (S4), the IPA gas adsorbing particles is exhausted from the drying processing unit 17 using, for example, a pump. As a result, the particles floating and adhering in the drying processing unit 17 are discharged to the outside of the drying processing unit 17 together with the IPA gas.

That is, the number of the floating and adhering particles in the drying processing unit 17 may be reduced by the cleaning gas filling process (S3) and the exhausting process (S4). Therefore, according to the cleaning process (S2) of the substrate processing system 1 according to the exemplary embodiment, a large number of particles may be suppressed from adhering to the wafers in the drying processing unit 17 in which the drying process using a supercritical fluid (S1) is performed.

<Outline of Substrate Processing System>

Subsequently, a schematic outline of a substrate processing system 2 according to an exemplary embodiment will be described with reference to FIG. 2. FIG. 2 is a view illustrating a schematic configuration of the substrate processing system 2 according to the exemplary embodiment. In the following, in order to clarify positional relationships, an X-axis, a Y-axis, and a Z-axis which are orthogonal to each other will be defined. The positive Z-axis direction will be regarded as a vertically upward direction.

As illustrated in FIG. 2, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C are placed each of which accommodates a plurality of semiconductor wafers W (hereinafter, referred to as "wafers W") in a horizontal state.

The transfer section 12 is provided adjacent to the carrier placing section 11, and provided with a substrate transfer device 13, a delivery unit 14, and a jig placing unit 21. The substrate transfer device 13 is provided with a wafer holding mechanism configured to hold the wafers W. Further, the substrate transfer device 13 is movable horizontally and vertically and pivotable around a vertical axis, and transfers the wafers W between the carriers C and the delivery unit 14 using the wafer holding mechanism.

A jig 22 is placed on the jig placing unit 21. Here, the wafer holding mechanism in the above-described wafer transfer device 13 also has a function of holding the jig 22. Then, the wafer transfer device 13 transfers the jig 22 between the jig placing unit 21 and the delivery unit 14 using the wafer holding mechanism.

The processing station 3 is provided adjacent to the transfer section 12. The processing station 3 includes a transfer section 15, a plurality of cleaning processing units 16, and a plurality of drying processing units 17. The plurality of cleaning processing units 16 and the plurality of drying processing units 17 are arranged side by side on both sides of the transfer section 15. Further, the arrangement and number of the cleaning processing units 16 and the drying processing units 17 illustrated in FIG. 2 are merely examples, and are not limited to those illustrated in this figure.

The transfer section 15 is provided with a substrate transfer device 18 therein. The substrate transfer device 18 is provided with a wafer holding mechanism configured to hold the wafers W and the jig 22. Further, the substrate transfer device 18 is movable horizontally and vertically and pivotable around a vertical axis. The substrate transfer device 18 transfers the wafers W or the jig 22 among the delivery unit 14, the cleaning processing units 16, and the drying processing units 17 using the wafer holding mechanism.

The cleaning processing units 16 perform a predetermined cleaning process on the wafers W transferred by the substrate transfer device 18. The configuration example of the cleaning processing units 16 will be described later.

The drying processing units 17 perform the above-described drying process on the wafers W cleaned by the cleaning processing units 16. The configuration example of the drying processing units 17 will be described later.

Further, the substrate processing system 1 is provided with a control device 4. The control device 4 is, for example, a computer, and includes a controller 19 and a storage unit 20.

The controller 19 includes a microcomputer having, for example, a central processing unit (CPU), a read only memory (ROM), a random access memory (RAM), and an input/output port, and various circuits. The CPU of the microcomputer implements the control to be described later by reading and executing a program stored in the ROM.

Further, the program may be recorded in a computer-readable storage medium, and installed from the storage medium to the storage unit 20 of the control device 4. The computer-readable storage medium may be, for example, a hard disc (HD), a flexible disc (FD), a compact disc (CD), a magneto-optical disc (MO), or a memory card.

The storage unit 20 is implemented by, for example, a semiconductor memory device such as a RAM or a flash memory, or a storage device such as a hard disk or an optical disk.

In the substrate processing system 1 configured as described above, the substrate transfer device 13 of the carry-in/out station 2 first takes out wafers W from a carrier C placed in the carrier placing section 11, and then places the taken wafers W on the delivery unit 14. The wafers W placed on the delivery unit 14 are taken out from the delivery unit 14 by the substrate transfer device 18 of the processing station 3 and carried into the cleaning processing units 16.

The wafers W carried into the cleaning processing units 16 are subjected to a cleaning process by the cleaning processing units 16, and then, carried out from the cleaning processing units 16 by the substrate transfer device 18. The wafers W carried out from the cleaning processing unit 16 are carried into the drying processing units 17 by the substrate transfer device 18 and subjected to a drying process by the drying processing units 17.

The wafers W subjected to the drying process by the drying processing units 17 are carried out from the drying processing units 17 by the substrate transfer device 18, and placed on the delivery unit 14. Then, the processed wafers W placed on the delivery unit 14 are returned to a carrier C of the carrier placing sections 11 by the substrate transfer device 13.

<Outline of Cleaning Processing Unit>

Figure 3:
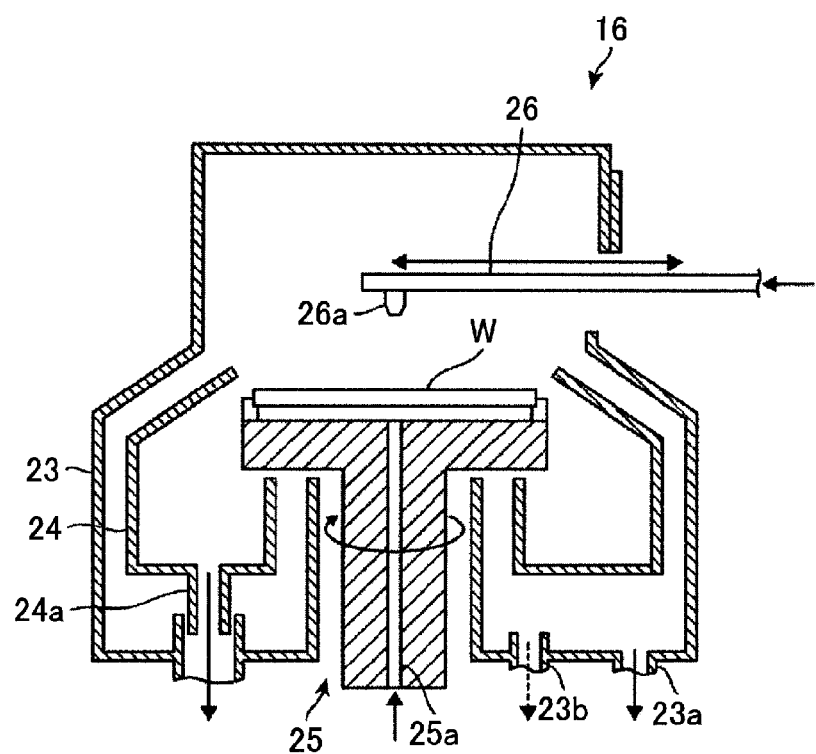
FIG. 3 is a cross-sectional view illustrating a configuration of a cleaning processing unit.

Next, a schematic outline of the cleaning processing unit 16 will be described with reference to FIG. 3. FIG. 3 is a cross-sectional view illustrating a configuration of the cleaning processing unit 16. The cleaning processing unit 16 is configured as a single-wafer cleaning unit that cleans the wafers W one by one, for example, by spin cleaning.

As illustrated in FIG. 3, the cleaning processing unit 16 holds a wafer W substantially horizontally with the wafer holding mechanism 25 disposed in an outer chamber 23 that forms a processing space, and rotates the wafer W by rotating the wafer holding mechanism 25 around the vertical axis. In addition, the cleaning processing unit 16 causes a nozzle arm 26 to be advanced into the upper side of the rotating wafer W and performs a cleaning process of the surface of the wafer W by supplying a chemical liquid and a rinse liquid from a chemical liquid nozzle 26a provided at the front edge portion of the nozzle arm 26 in a predetermined order.

Further, a chemical liquid supply path 25a is also formed inside the wafer holding mechanism 25 in the cleaning processing unit 16. Then, the back surface of the wafer W is cleaned by the chemical liquid and the rinse liquid from the chemical liquid supply path 25a.

In the above-described cleaning process of the wafer W, for example, an SC1 liquid (a mixture of ammonia and hydrogen peroxide), which is an alkaline chemical liquid, is first used to remove particles and an organic contaminant, and then rinse cleaning is performed by deionized water (hereinafter, referred to as "DIW"), which is a rinse liquid. Next, a natural oxide film is removed by a diluted hydrofluoric acid (hereinafter, referred to as "DHF") aqueous solution, which is an acidic chemical liquid, and then rinse cleaning by DIW is performed.

The above-described various types of chemical liquids are received by the outer chamber 23 or an inner cup 24 disposed in the outer chamber 23, and are discharged from a drain port 23a provided in the bottom portion of the outer chamber 23 or a drain port 24a provided in the bottom portion of the inner cup 24. Further, the atmosphere in the outer chamber 23 is exhausted from an exhaust port 23b provided in the bottom portion of the outer chamber 23.

After the rinse process of the wafer W described above, the IPA liquid in a liquid state (hereinafter, referred to as "IPA liquid") is supplied to the front and back surfaces of the wafer W while the wafer holding mechanism 25 is rotated, and the DIW remaining on both surfaces of the wafer W is replaced with the IPA liquid. Thereafter, the rotation of the wafer holding mechanism 25 is stopped slowly.

After the cleaning process is completed in this way, the wafer W is delivered to the substrate transfer apparatus 18 by a delivery mechanism (not illustrated) provided in the wafer holding mechanism 25 in a state in which the IPA liquid 71 (see, e.g., FIGS. 7A to 7D) is spread over the surface of the wafer (the state in which the liquid film of the IPA liquid 71 is formed on the surface of the wafer W), and is carried out from the cleaning processing unit 16.

Here, the IPA liquid 71 is spread over the surface of the wafer W functions as a drying preventing liquid that prevents the occurrence of the pattern collapse due to the evaporation (vaporization) of the liquid on the surface of the wafer W during the transfer of the wafer W from the cleaning processing unit 16 to the drying processing unit 17 or during the carry-in of the wafer W into the drying processing unit 17.

After the cleaning process in the cleaning processing unit 16 is completed, the wafer W having the IPA liquid spread over the surface thereof is transferred to the drying processing unit 17. In addition, the $CO_2$ supercritical fluid 70 (see, e.g., FIGS. 7A to 7D) is brought into contact with the IPA liquid 71 on the surface of the wafer W in the drying processing unit 17, whereby the IPA liquid 71 is dissolved in the $CO_2$ supercritical fluid 70 and removed, and the wafer W is dried.

<Outline of Drying Processing Unit>

Figure 4:
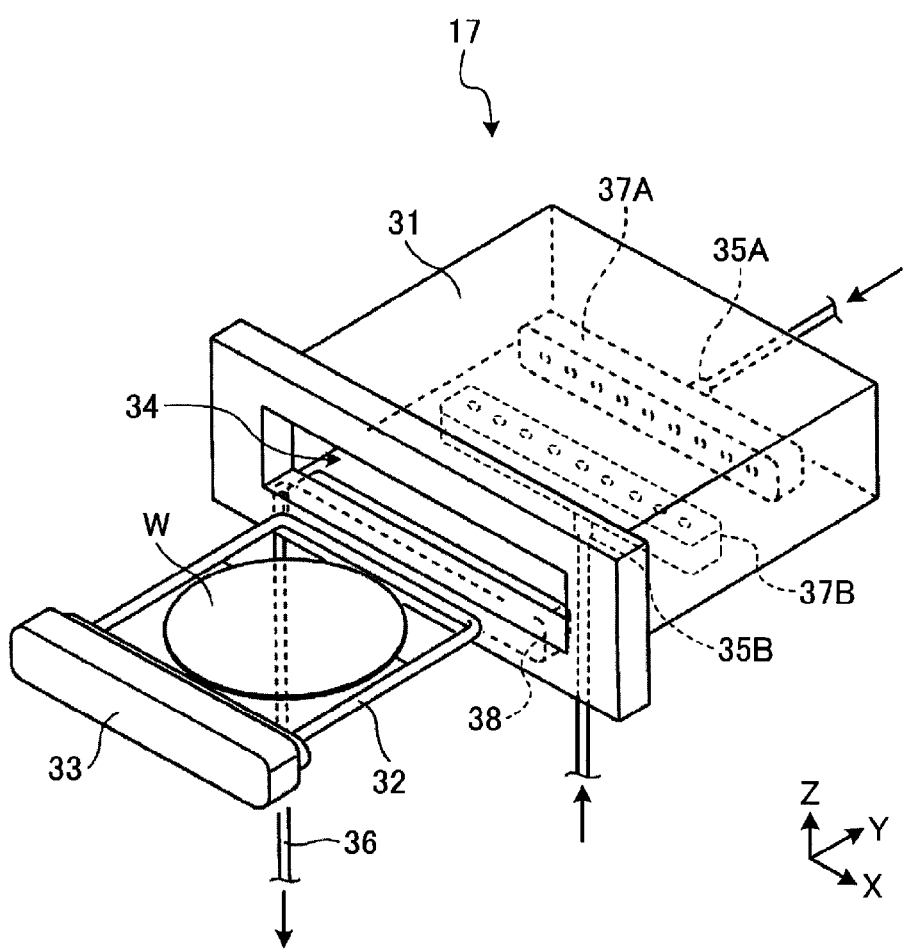
FIG. 4 is an external perspective view illustrating a configuration of a drying processing unit.

In the following, the configuration of the drying processing unit 17 will be described first, and then the configuration of the entire system in the drying processing unit 17 will be described. FIG. 4 is an external perspective view illustrating the configuration of the drying processing unit 17.

The drying processing unit 17 has a main body 31, a holding plate 32, and a cover member 33. An opening 34 is formed in a housing type main body 31 in order to carry in/out a wafer W therethrough. The holding plate 32 horizontally holds a wafer W which is a processing target. The cover member 33 supports the holding plate 32 and hermetically seals the opening 34 when the wafer W is carried into the main body 31.

The main body 31 is, for example, a container in which a processing space capable of accommodating a wafer W having a diameter of 300 mm is formed, and is provided with supply ports 35A and 35B, and a discharge port 36 in the wall thereof. The supply ports 35A and 35B, and the discharge port 36 are connected to supply lines configured to circulate the supercritical fluid 70 (see, e.g., FIGS. 7A to 7D) and provided on the upstream side and the downstream side of the drying processing unit 17, respectively. A configuration example of the supply line will be described later.

The supply port 35A is connected to the side surface opposite to the opening 34 in the housing-like main body 31. Further, the supply port 35B is connected to the bottom surface of the main body 31. The discharge port 36 is also connected to the lower side of the opening 34. In addition, FIG. 4 illustrates two supply ports 35A and 35B, and one discharge port 36, but the number of the supply ports 35A and 35B, and the discharge port 36 is not particularly limited.

Further, fluid supply headers 37A and 37B, and a fluid discharge header 38 are provided inside the main body 31. The fluid supply headers 37A and 37B, and the fluid discharge header 38 are all formed with a plurality of apertures.

The fluid supply header 37A is connected to the supply port 35A and is provided adjacent to the side surface opposite to the opening 34 in the housing type main body 31. Further, the plurality of apertures formed in the fluid supply header 37A face the opening 34 side.

The fluid supply header 37B is connected to the supply port 35B and is provided at the center of the bottom surface inside the housing-like main body 31. Further, the plurality of apertures formed in the fluid supply header 37B face the upper side.

The fluid discharge header 38 is connected to the discharge port 36 and provided adjacent to the side surface on the opening 34 side inside the housing-like main body 31 and below the opening 34. Further, the plurality of apertures formed in the fluid discharge header 38 face the fluid supply header 37A side.

The fluid supply headers 37A and 37B supply the supercritical fluid 70 into the main body 31. Further, the fluid discharge header 38 guides the supercritical fluid 70 in the main body 31 to the outside of the main body 31 and discharges the supercritical fluid 70. The supercritical fluid 70 discharged to the outside of the main body 31 via the fluid discharge header 38 contains the IPA liquid 71 (see, e.g., FIGS. 7A to 7D) dissolved in the supercritical fluid 70 from the surfaces of the wafer W.

The supercritical fluid 70 is supplied into the main body 31 from the apertures of the fluid supply headers 37A and 37B arranged as described above and the supercritical fluid 70 is discharged from the main body 31 through the apertures of the fluid discharger header 38 so that a laminar flow of the supercritical fluid 70 flowing in a predetermined direction around the wafer W is formed inside the main body 31.

The laminar flow of the supercritical fluid 70 flows from, for example, the fluid supply header 37A toward the upper portion of the opening 34 along the surface of the wafer W. In addition, the laminar flow of the supercritical fluid 70 changes its direction downward above the opening 34 and flows near the opening 34 toward the fluid discharge header 38.

In the example of the laminar flow, an opening (not illustrated) is formed between the wafer W and the cover member 33 in the holding plate 32 inside the drying processing unit 17, and the laminar flow of the supercritical fluid 70 passes through the opening.

In addition, from the viewpoint of reducing the load that may be applied to the wafer W when the supercritical fluid 70 is supplied into the main body 31 and when the supercritical fluid 70 is discharged from the main body 31, a plurality of fluid supply headers and a plurality of fluid discharge headers may be provided.

The drying processing unit 17 further includes a pressing mechanism (not illustrated). The pressing mechanism serves to seal the processing space by pushing the cover member 33 toward the main body 31 against an internal pressure caused by the supercritical fluid 70 in a supercritical state, which is supplied into the processing space of the main body 31. Further, for example, a heat insulating material or a tape heater may be provided on the surface of the main body 31 so that the supercritical fluid 70 supplied into the processing space maintains a predetermined temperature.

Figure 5:
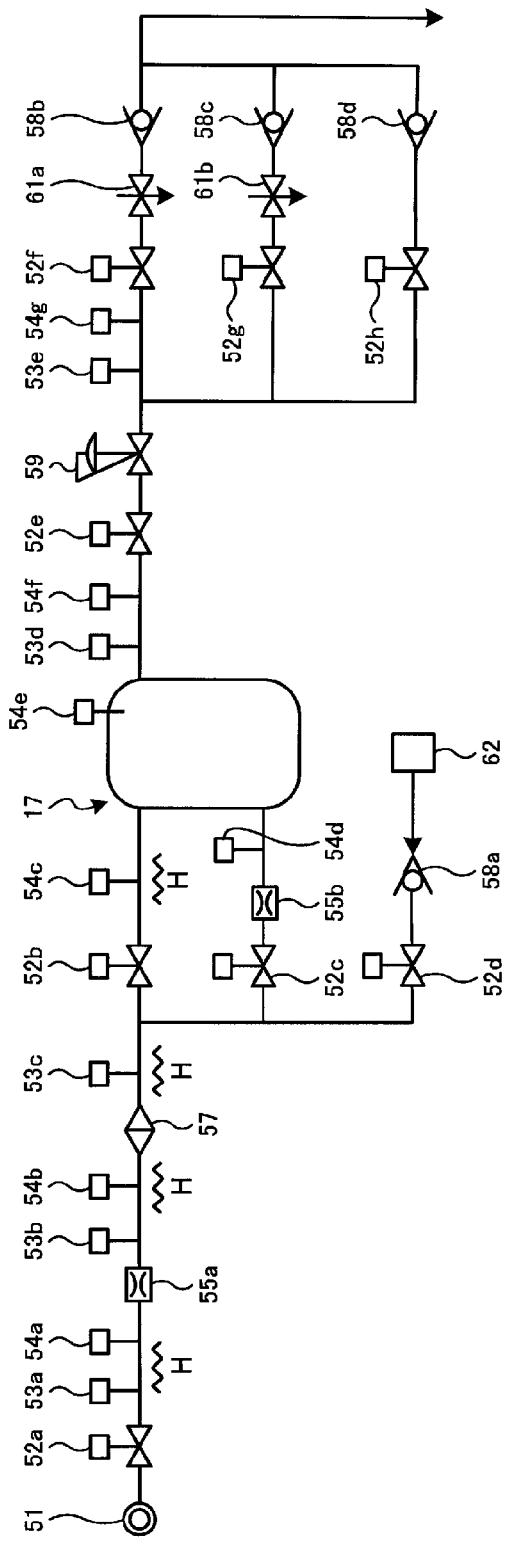
FIG. 5 is a diagram illustrating a configuration example of the entire system of the drying processing unit.

Next, the configuration of the entire system of the drying processing unit 17 will be described with reference to FIG. 5. FIG. 5 is a diagram illustrating a configuration example of the entire system of the drying processing unit.

In the entire system, a fluid supply source 51 is provided on the upstream side of the drying processing unit 17, and the supercritical fluid 70 is supplied from the fluid supply source 51 to a supply line configured to circulate the supercritical fluid 70 (see, e.g., FIGS. 7A to 7D) in the drying processing unit 17. The fluid supply source 51 stores, for example, raw material $CO_2$ for generating a $CO_2$ supercritical fluid 70.

Further, a valve 52a, an orifice 55a, a filter 57, and a valve 52b are sequentially provided between the fluid supply source 51 and the drying processing unit 17 from the upstream side to the downstream side. In addition, the terms "upstream side" and "downstream side" used herein refer to the flow direction of the supercritical fluid 70 in the supply line.

The valve 52a is a valve that adjusts the on and off of the supply of the supercritical fluid 70 from the fluid supply source 51, and causes the supercritical fluid 70 to flow to the supply line on the downstream side in an open state and does not cause the supercritical fluid 70 to flow to the supply line on the downstream side in a closed state. For example, when the valve 52a is in the open state, the supercritical fluid 70 having a high pressure of about 16 to 20 MPa is supplied from the fluid supply source 51 to the supply line via the valve 52a.

The orifice 55a has a function of regulating the pressure of the supercritical fluid 70 supplied from the fluid supply source 51. The orifice 55a may flow the supercritical fluid 70 whose pressure is adjusted to about 16 MPa, for example, on a supply line on the downstream side of the orifice 55a.

The filter 57 removes the foreign matter contained in the supercritical fluid 70 sent from the orifice 55a and causes the clean supercritical fluid 70 to flow to the downstream side.

The valve 52b is a valve that adjusts the on and off of the supply of the supercritical fluid 70 to the drying processing unit 17. The supply line connected to the drying processing unit 17 from the valve 52b is connected to a supply port 35A illustrated in FIG. 4, and the supercritical fluid 70 flowing through the valve 52b is supplied into the main body 31 via the supply port 35A and the fluid supply header 37A.

Further, in the entire system of the drying processing unit 17 illustrated in FIG. 5, the supply line branches off between the filter 57 and the valve 52b. Specifically, a supply line connected to the drying processing unit 17 via the valve 52c and the orifice 55b, and a supply line connected to a purging device 62 via a valve 52d and a check valve 58a branch off from the supply line between the filter 57 and the valve 52b.

The supply line connected to the drying processing unit 17 via the valve 52c and the orifice 55b is an auxiliary flow path configured to supply the supercritical fluid 70 to the drying processing unit 17. The supply line is connected to a supply port 35B illustrated in FIG. 4, and the supercritical fluid 70 flowing through the valve 52c is supplied into the main body 31 via the supply port 35B and the fluid supply header 37B.

The supply line connected to the purging device 62 via the valve 52d and the check valve 58a is a flow path configured to supply an inert gas such as, for example, nitrogen to the drying processing unit 17, and is utilized, for example, when the supply of the supercritical fluid 70 from the fluid supply source 51 to the drying processing unit 17 is stopped.

For example, when the drying processing unit 17 is filled with the inert gas to be kept clean, the valve 52d and the valve 52b are controlled to the open state, and the inert gas sent from the purging device 62 to the supply line is supplied to the drying processing unit 17 via the check valve 58a, the valve 52d, and the valve 52b.

On the downstream side of the drying processing unit 17 in the entire system of the drying processing unit 17, a valve 52e, an exhaust control valve 59, and a valve 52f are sequentially provided from the upstream side to the downstream side.

The valve 52e is a valve that adjusts the on and off of the discharge of the supercritical fluid 70 from the drying processing unit 17. When the supercritical fluid 70 is discharged from the drying processing unit 17, the valve 52e is controlled to an open state, and when the supercritical fluid 70 is not discharged from the drying processing unit 17, the valve 52e is controlled to the closed state.

Further, the supply line extending between the drying processing unit 17 and the valve 52e is connected to the discharge port 36, and the supercritical fluid 70 inside the main body 31 of the drying processing unit 17 is sent toward the valve 52e via the fluid discharge header 38 and the discharge port 36 illustrated in FIG. 4.

The exhaust control valve 59 is a valve that adjusts the discharge amount of the supercritical fluid 70 from the drying processing unit 17 and may be configured by, for example, a back pressure valve. The opening degree of the exhaust control valve 59 is adjusted adaptively under the control of the control device 4 in accordance with the desired discharge amount of the supercritical fluid 70 from the inside of the main body 31.

The valve 52f is a valve that adjusts the on and off of the discharge of the supercritical fluid 70 from the drying processing unit 17 to the outside. When the supercritical fluid 70 is discharged to the outside, the valve 52f is controlled to the open state, and when the supercritical fluid 70 is not discharged, the valve 52f is controlled to the closed state. Further, an exhaust control needle valve 61a and a check valve 58b are provided on the downstream side of the valve 52f.

The exhaust control needle valve 61a is a valve that adjusts the discharge amount of the supercritical fluid 70 sent to the outside via the valve 52f, and the opening degree of the exhaust control needle valve 61a is adjusted depending on the desired discharge amount of the supercritical fluid 70. The check valve 58b is a valve that suppresses the back flow of the supercritical fluid 70 to be discharged, and has a function of reliably discharging the supercritical fluid 70 to the outside.

Further, a supply line branches off between the exhaust control valve 59 and the valve 52f in the drying processing unit 17 illustrated in FIG. 5. Specifically, a supply line connected to the outside via the valve 52g, and a supply line connected to the outside via a valve 52h branch off from the supply line between the exhaust control valve 59 and the valve 52f.

Similarly to the valve 52f, the valve 52g and the valve 52h are valves that adjust the on and off of the discharge of the supercritical fluid 70 to the outside. An exhaust control needle valve 61b and a check valve 58c are provided on the downstream side of the valve 52g to adjust the discharge amount of the supercritical fluid 70 and suppress the back flow of the supercritical fluid 70. A check valve 58d is provided on the downstream side of the valve 52h to suppress the back flow of the supercritical fluid 70.

When the supercritical fluid 70 is discharged from the drying processing unit 17, at least one valve of the valve 52f, the valve 52g, and the valve 52h is controlled to the open state. The discharge amount of the supercritical fluid 70 to the outside may be finely controlled by discharging the supercritical fluid 70 to the outside through a plurality of valves (valves 52f, 52g, and 52h) in the entire system of the drying processing unit 17.

Further, a pressure sensor that detects the pressure of the supercritical fluid 70 and a temperature sensor that detects the temperature of the supercritical fluid 70 are provided at various points of the above-described supply line. In the example illustrated in FIG. 5, a pressure sensor 53a and a temperature sensor 54a are provided between the valve 52a and the orifice 55a, and a pressure sensor 53b and a temperature sensor 54b are provided between the orifice 55a and the filter 57.

In addition, a pressure sensor 53c is provided between the filter 57 and the valve 52b, a temperature sensor 54c is provided between the valve 52b and the drying processing unit 17, a temperature sensor 54d is provided between the orifice 55b and the drying processing unit 17, and a temperature sensor Me is provided in the drying processing unit 17.

In addition, a pressure sensor 53d and a temperature sensor 54f are provided between the drying processing unit 17 and the valve 52e, and a pressure sensor 53e and a temperature sensor Mg are provided between the exhaust control valve 59 and the valve 52f.

Further, a heater H is provided at an arbitrary place where the supercritical fluid 70 flows in the drying processing unit 17. In the example illustrated in FIG. 5, the heaters H are provided between the orifice 55a and the valve 52a, which is a supply line of the upstream side of the drying processing unit 17, between the orifice 55a and the filter 57, between the filter 57 and the valve 52b, and between the valve 52b and the drying processing unit 17.

In the meantime, the heaters H may be provided in the drying processing unit 17 or elsewhere including the supply line on the downstream side of the drying processing unit 17. That is, the heaters H may be provided in all the flow paths until the supercritical fluid 70 supplied from the fluid supply source 51 is discharged to the outside.

In the exemplary embodiment, from the viewpoint of adjusting the temperature of the supercritical fluid 70 supplied to the drying processing unit 17, the heater H may be provided at least at a position where the temperature of the supercritical fluid 70 flowing at the upstream side of the drying processing unit 17 may be adjusted.

Figure 6:
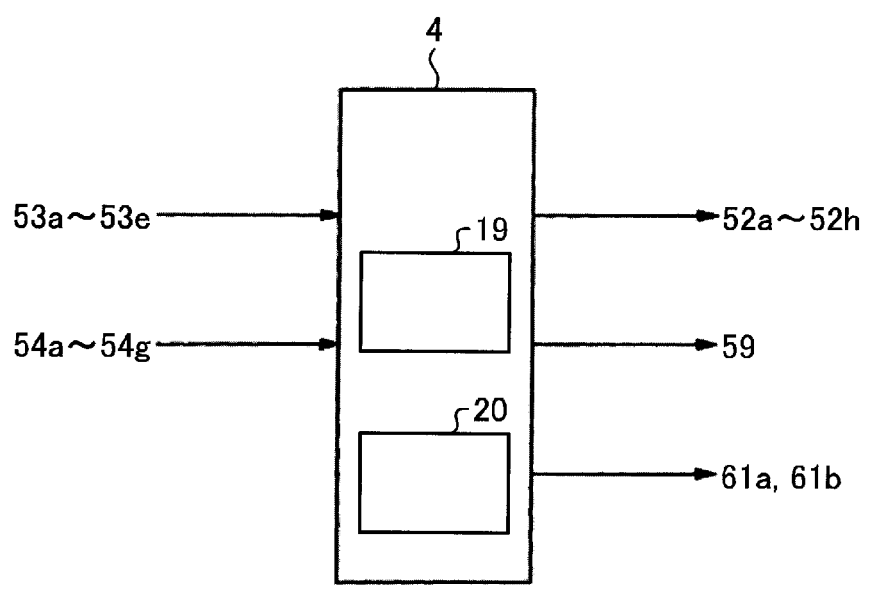
FIG. 6 is a block diagram illustrating a functional configuration of a controller.

FIG. 6 is a block diagram illustrating a functional configuration of a control device 4. As described above, the control device 4 includes the controller 19 and the storage unit 20. The control device 4 receives a measurement signal from various elements illustrated in FIG. 5, and also transmits a control instruction signal to various elements illustrated in FIG. 5.

The control device 4 receives the measurements results of the pressure sensors 53a to 53e and the temperature sensors 54a to 54g, and also transmits control instruction signals to the valves 52a to 52h, the exhaust control valve 59, and the exhaust control needle valves 61a and 61b. The signals that may be transmitted/received by the control device 4 is not particularly limited.

<Outline of Drying Process Using Supercritical Fluid>

Next, an outline of a drying process of the IPA liquid 71 using the supercritical fluid 70 will be described. FIGS. 7A to 7D are enlarged cross-sectional views for explaining a drying mechanism of the IPA liquid 71, in which patterns P provided on a wafer W are briefly illustrated.

Figure 7A:
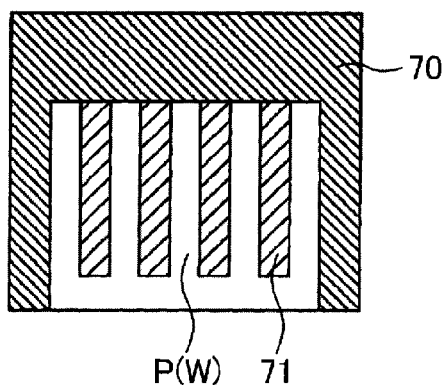
FIGS. 7A to 7D are enlarged cross-sectional views for explaining an IPA drying mechanism, in which patterns provided on a wafer are briefly illustrated.

As illustrated in FIG. 7A, only the IPA liquid 71 is filled between the patterns P when the $CO_2$ supercritical fluid 70 is introduced into the main body 31 of the drying processing unit 17 in the drying processing unit 17.

Figure 7B:
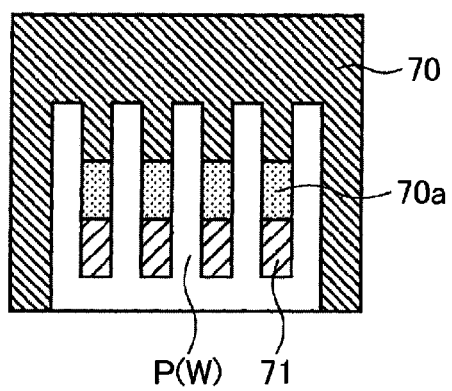

The IPA liquid 71 between the patterns P gradually dissolves in the $CO_2$ supercritical fluid 70 due to contact with the $CO_2$ supercritical fluid 70 and is gradually replaced with the supercritical fluid 70 as illustrated in FIG. 7B. In this case, there is a mixed fluid 70a in which the IPA liquid 71 and the $CO_2$ supercritical fluid 70 are mixed between the patterns P, in addition to the IPA liquid 71 and the $CO_2$ supercritical fluid 70.

Figure 7C:
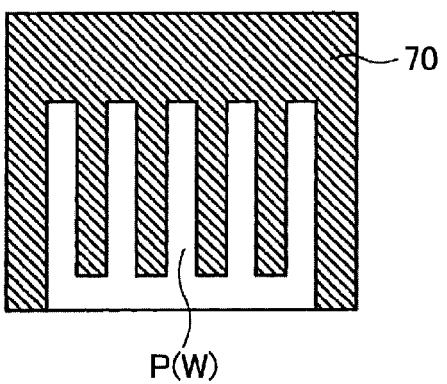

In addition, as the substitution from the $CO_2$ IPA liquid 71 to the supercritical fluid 70 proceeds between the patterns P, the IPA liquid 71 is removed between the patterns P, and finally, only the $CO_2$ supercritical fluid 70 fills the area between the patterns P, as illustrated in FIG. 7C.

Figure 7D:
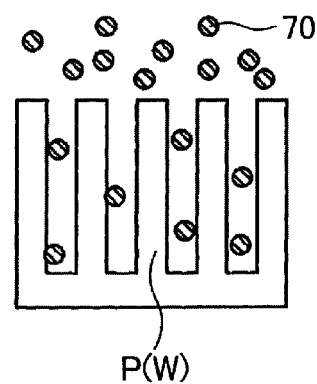

As illustrated in FIG. 7D, after the IPA liquid 71 is removed from the area between the patterns P, the $CO_2$ supercritical liquid is changed from a supercritical state to a gaseous state by reducing the pressure in the main body 31 to an atmospheric pressure, and only the gas occupies the area between the patterns P. In this way, the IPA liquid 71 in the area between the patterns P is removed and the drying process of the wafer W is completed.

Here, the supercritical fluid 70 has a smaller viscosity than the liquid (e.g., the IPA liquid 71) and has a high ability of dissolving the liquid. In addition, there is no interface between the supercritical liquid 70 and the liquid or gas in equilibrium. As a result, in the drying process using the above-described supercritical fluid 70, the liquid may be dried without being influenced by a surface tension, so that the pattern collapse of the patterns P may be suppressed.

In the meantime, in the above-described drying process using the $CO_2$ supercritical fluid 70 in the substrate processing system 1, when a plurality of wafers W are repeatedly dried in the same drying processing unit 17, a large number of particles may adhere to the wafers W.

As to the particles, it is considered that after the moisture or oil kept in a fluid state in the raw material $CO_2$ stored in the fluid supply source 51 illustrated in FIG. 5 passes through the filter 57, the moisture or oil is turned into mists in the drying processing unit 17 for some reasons to float and adhere to the drying processing unit 17. In addition, the yield of wafers W may be lowered by the large number of adhering particles.

Therefore, according to the cleaning process of the substrate processing system 1 according to the exemplary embodiment, the number of the particles may be reduced by performing a predetermined cleaning process on the drying processing unit 17.

<Details of Cleaning Process of Substrate Processing System>

Figure 8A:
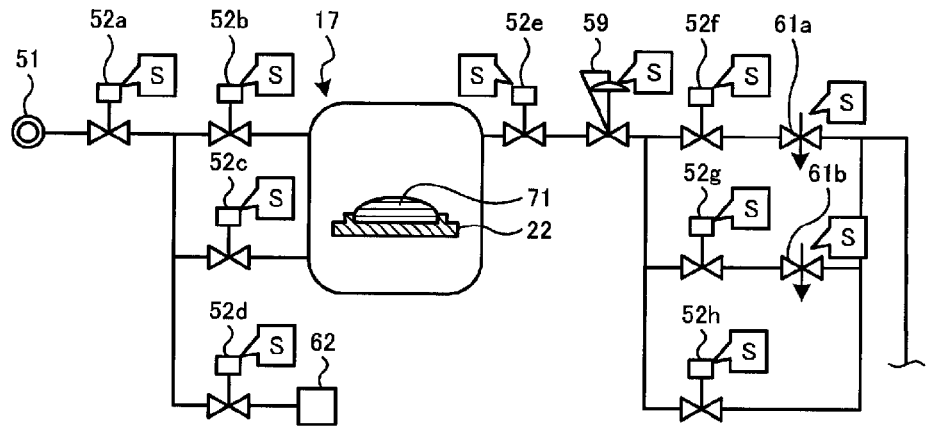
FIG. 8A is a diagram illustrating an outline of a cleaning liquid carrying-in process according to the exemplary embodiment.

Subsequently, the details of a cleaning process of the substrate processing system 1 according to the exemplary embodiment will be described with reference to FIGS. 8A to 8C. In the cleaning process of the substrate processing system 1 according to the exemplary embodiment, a cleaning liquid carrying-in process is first performed. FIG. 8A is a diagram illustrating an outline of a cleaning liquid carrying-in process according to the exemplary embodiment.

Further, in the entire system of the drying processing unit 17 illustrated in FIG. 5, FIGS. 8A to 8C illustrate valves 52a to 52h which may control the open state and the closed state by the controller 19, the exhaust control valve 59, and the exhaust control needle valves 61a and 61b, and indicate "O" when each of the valves is in an open state and indicate "S" adjacent to each valve when each valve is in a closed state.

In addition, for example, in the case where the exhaust control valve 59 or the exhaust control needle valves 61a and 61b is a valve that cannot be brought into a fully closed state, even when a valve is in the state indicated by "S" in the following description, the valve may not be fully closed.

As illustrated in FIG. 8A, in the cleaning liquid carrying-in process, the jig 22 filled with the IPA liquid 71 is carried into the drying processing unit 17. The specific processes to be carried out for the cleaning liquid carrying-in process are as follows.

First, the substrate transfer device 13 of the carry-in/out station 2 illustrated in FIG. 2 takes out the jig 22 placed in the jig placing unit 21, and then places the taken jig 22 on the delivery unit 14. The jig 22 placed on the delivery unit 14 is taken out from the delivery unit 14 by the substrate transfer device 18 of the processing station 3 and carried into the cleaning processing unit 16.

The jig 22 carried into the cleaning processing unit 16 is subjected to the liquid filling process of the IPA liquid 71 by the cleaning processing unit 16. Specifically, the cleaning processing unit 16 causes the nozzle arm 26 to advance to the upper side of the jig 22 held in the wafer holding mechanism 25 illustrated in FIG. 3 and supplies a predetermined amount of the IPA liquid 71 from the chemical liquid nozzle 26a provided at the front end portion, thereby performing the liquid filling process on the jig 22.

After completing such a liquid filling process, the jig 22 is delivered to the substrate transfer device 17 illustrated in FIG. 2 in a state where the IPA liquid 71 is spread over the surface thereof, and is carried out from the cleaning processing unit 16. The jig 22 carried out from the cleaning processing unit 16 is carried into the drying processing unit 17 by the substrate transfer device 18. By this process, as illustrated in FIG. 8A, the jig 22 filled with the IPA liquid 71 is carried into the drying processing unit 17 (i.e., the cleaning liquid carrying-in process).

Further, as illustrated in FIG. 8A, the valves 52a to 52h, the exhaust control valve 59, and the exhaust control needle valves 61a and 61b are all controlled to the closed state during the cleaning liquid carrying-in process.

In the cleaning process of the substrate processing system 1 according to the exemplary embodiment, a cleaning liquid vaporizing process is performed following the cleaning liquid carrying-in process. FIG. 8B is a diagram illustrating an outline of the cleaning liquid vaporizing process according to the exemplary embodiment.

Figure 8B:
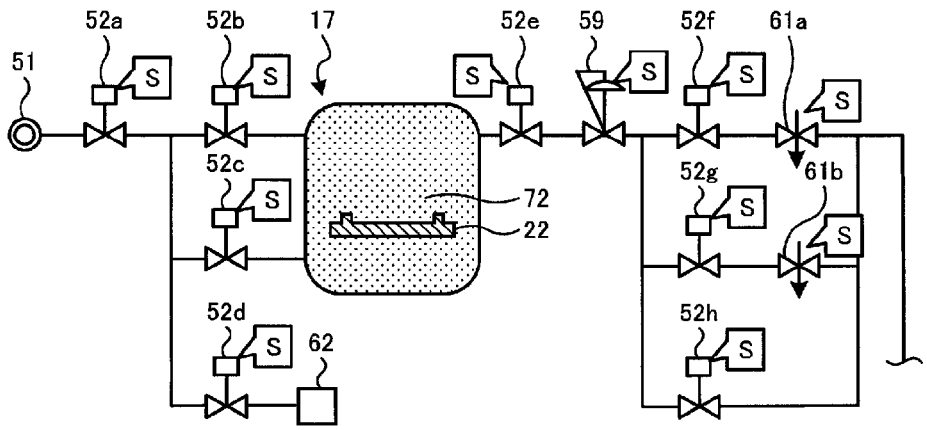
FIG. 8B is a diagram illustrating an outline of a cleaning liquid vaporizing process according to the exemplary embodiment.

As illustrated in FIG. 8B, in the cleaning liquid vaporizing process, the IPA liquid 71 filled in the jig 22 is vaporized (evaporated). Then, the IPA gas 72 generated by the vaporization is filled in the drying processing unit 17. Thus, the IPA gas 72 is filled in the drying processing unit 17. That is, the IPA gas 72 is saturated in the drying processing unit 17. Then, the IPA gas 72 is caused to stand by for a predetermined time in a state of being filled in the drying processing unit 17.

Then, the IPA gas filled in the drying processing unit 17 adsorbs the particles that are floating and adhering in the drying processing unit 17 by the above-described cleaning liquid vaporizing process.

The cleaning liquid vaporizing process is performed for a time sufficient for the IPA gas 72 to be filled in the drying processing unit 17 to adsorb the floating and adhering particles. The cleaning liquid vaporizing process is performed for a longer time than the normal running time for the drying process of the wafer W using, for example, the supercritical fluid 70.

Here, the normal running time is defined as the time for which the IPA liquid 71 spread over the surface of the wafer W is transferred into the drying processing unit 17, as illustrated in FIGS. 7A to 7D, until the IPA liquid 71 comes into contact with the supercritical fluid 70 (e.g., about 10 seconds). In other words, the normal running time is the time for which the IPA liquid 71 spread over the surface of the wafer W is not partially dried on the surface of the wafer W.

The cleaning liquid vaporizing process may be performed for, for example, 10 minutes or more. Thus, the IPA gas 72 filled in the drying processing unit 17 may sufficiently adsorb the particles that are floating and adhering in the drying processing unit 17.

Further, in the cleaning liquid vaporizing process, for example, the jig 22 may be heated to about 100° C. as a method for vaporizing (evaporating) the IPA liquid 71 filled in the jig 22. In addition, the entire drying processing unit 17 may be heated to about 100° C. With this method, the IPA liquid 71 having a boiling point of 82.4° C. may be efficiently vaporized (evaporated).

Further, in the cleaning liquid vaporizing process, the jig 22 and the entire drying processing unit 17 may be heated to 100° C. or higher. By raising the temperature to a higher temperature in this way, the IPA liquid 71 in the drying processing unit 17 may be saturated in a short period of time, so that the cleaning liquid vaporizing process may be completed in a short time.

Further, as illustrated in FIG. 8B, the valves 52a to 52h, the exhaust control valve 59, and the exhaust control needle valves 61a and 61b are all controlled to the closed state during the cleaning liquid vaporizing process.

In the cleaning process of the substrate processing system 1 according to the exemplary embodiment, an exhausting process is performed following the cleaning liquid vaporizing process. FIG. 8C is a diagram illustrating an outline of the exhausting process according to the exemplary embodiment.

Figure 8C:
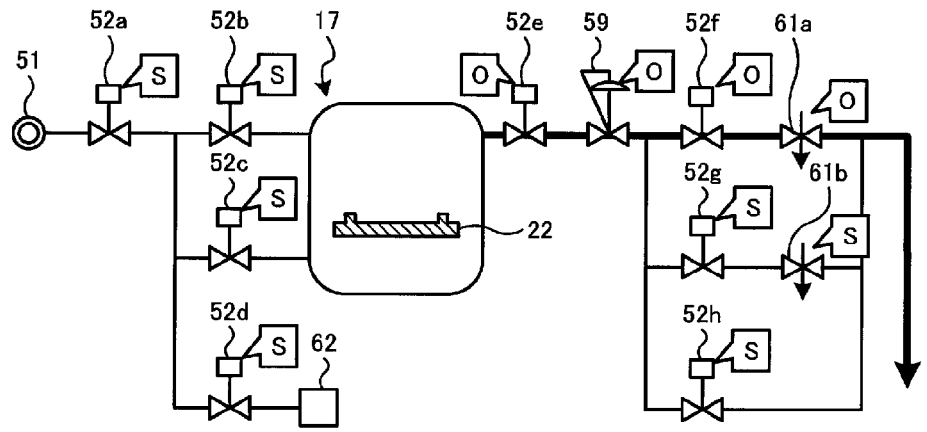
FIG. 8C is a diagram illustrating an outline of an exhausting process according to the exemplary embodiment.

In the exhausting process, the controller 19 of the control device 4 changes the valve 52e, the exhaust control valve 59, the valve 52f, and the exhaust control needle valve 61a on the downstream side of the drying processing unit 17 from the closed state to the open state, as illustrated in FIG. 8C. As a result, the IPA gas 72 adsorbing the particles that are floating and adhering in the drying processing unit 17 is discharged to the outside of the drying processing unit 17.

That is, the floating and adhering particles in the drying processing unit 17 may be removed together with the IPA gas 72. Therefore, since the number of floating and adhering particles in the drying processing unit 17 may be reduced, a large number of particles to the wafer W may be suppressed from adhering when the drying process using the supercritical fluid 70 is performed on the wafer W in the drying processing unit 17.

The cleaning process of the substrate processing system 1 according to the exemplary embodiment may be implemented by providing the jig placing unit 21 and the jig 22 inside the substrate processing system 1 without providing additional piping or valve in the drying processing unit 17. As a result, according to the exemplary embodiment, the cleaning process of the drying processing unit 17 may be performed at a low cost.

Further, in the cleaning process of the substrate processing system 1 according to the exemplary embodiment, an organic solvent (IPA liquid 71) of the same type as the organic solvent used in the drying process of the wafer W by the supercritical fluid 70 is also used in the cleaning process.

In this case, when, for example, the organic solvent of a type different from the organic solvent used in the drying process of the wafer W is used in the cleaning process, the different type of organic solvent may act as an impurity in the drying process of the wafer W by the supercritical fluid 70. Therefore, when the different type of organic solvent is used in the cleaning process and the drying process, the drying process of the wafer W may be adversely influenced.

However, in the cleaning process of the substrate processing system 1 according to the exemplary embodiment, since the same type of organic solvent used for the drying process of the wafer W is used for the cleaning process, the drying process of the wafer W may not be adversely influenced. Therefore, the drying process of the wafer W may be stably performed using the same type of organic solvent as the organic solvent used for the drying process of the wafer W in the cleaning process.

The cleaning process of the substrate processing system 1 according to the exemplary embodiment may be performed, for example, when the number of particles in the wafer W subjected to the drying process by a particle counter is measured in each drying processing unit 17 at any time and the number of measured particles exceeds a predetermined number.

Further, the cleaning process of the substrate processing system 1 according to the exemplary embodiment may be performed in each drying processing unit 17, for example, when the cumulative time of the drying process performed on the wafer W becomes longer than a predetermined time or when the cumulative number of wafers W subjected to the drying process is equal to or greater than a predetermined number of sheets.

In addition, FIG. 8C represents an example in which the valve 52e, the exhaust control valve 59, the valve 52f, and the exhaust control needle valve 61a are changed from the closed state to the open state. However, for example, the valves 52g and 52h, and the exhaust control needle valve 61b on the downstream side of the drying processing unit 17 may be opened to exhaust the IPA gas 72 to the outside of the drying processing unit 17.

Figure 9A:
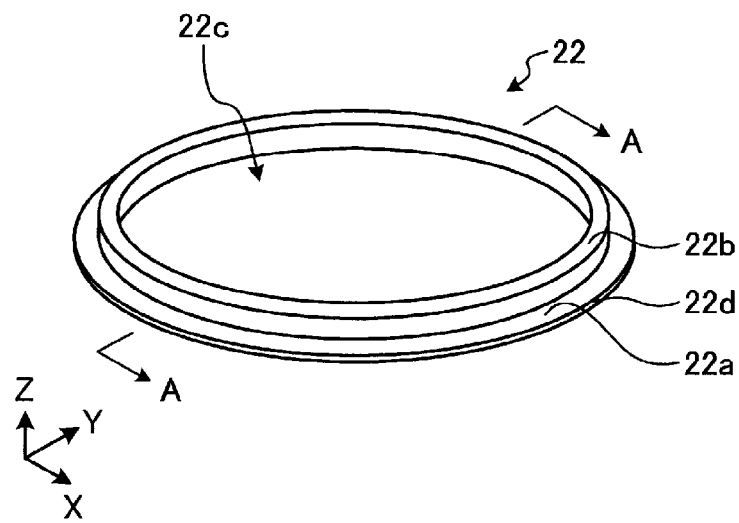
FIG. 9A is a perspective view illustrating an example of a jig according to the exemplary embodiment.

Subsequently, an example of the jig 22 used in the cleaning process of the substrate processing system 1 according to the exemplary embodiment will be described with reference to FIGS. 9A and 9B. FIG. 9A is a perspective view illustrating an example of the jig 22 according to the exemplary embodiment, and FIG. 9B is a cross-sectional view taken along line A-A of FIG. 9A.

Figure 9B:
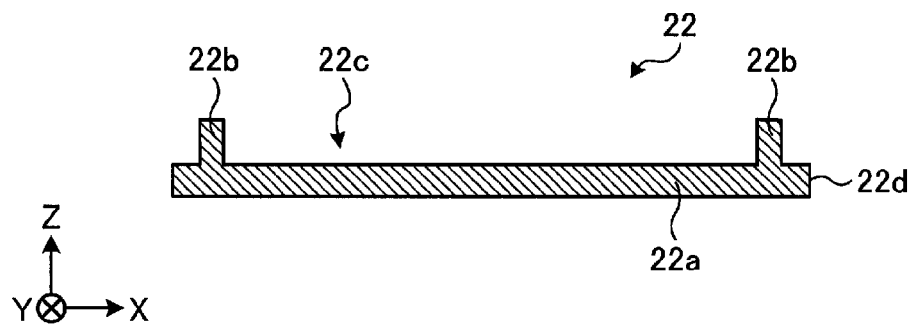
FIG. 9B is a cross-sectional view taken along line A-A of FIG. 9A.

As illustrated in FIGS. 9A and 9B, the jig 22 has a disk portion 22 and a ring-shaped portion 22b.

The disk portion 22a has a diameter and a thickness that are substantially equal to the wafer W. As a result, in the substrate processing system 1, the jig 22 may be transferred using the substrate transfer device 13, the transfer unit 14, and the substrate transfer device 18 used for the transfer of the wafer W, and the jig 22 may be carried into the cleaning processing unit 16 and the drying processing unit 17 configured to process the wafer W.

Further, when the wafers W having multiple types of diameters and thicknesses may be handled in the substrate processing system 1, the disk portion 22a may have a substantially equal diameter and thickness to one type of wafers W among the multiple types that may be handled in the substrate processing system 1.

The ring-shaped portion 22b is a portion protruding in a ring shape from the main surface on the top surface side of the disk portion 22a. Further, the disk portion 22a and the ring-shaped portion 22b form a recess 22c on the main surface of the top surface side of the disk portion 22a. By forming the recess 22c on the main surface of the top surface side of the disk portion 22a, the amount of the IPA liquid 71 that may be deposited on the surface of the jig 22 may be increased when compared with the case where the recess 22c is not formed. Therefore, the IPA liquid 71 in an amount sufficient to fill the IPA gas 72 in the drying processing unit 72 may be carried into the drying processing unit 17.

The ring-shaped portion 22b may be provided at a predetermined distance or more from an edge 22d of the disk portion 22a. As a result, the edge 22d of the disk portion 22a may be gripped and transferred when the jig 22 is transferred using the substrate transfer device 13, the transfer unit 14, and the substrate transfer device 18 in the substrate processing system 1.

Figure 9C:
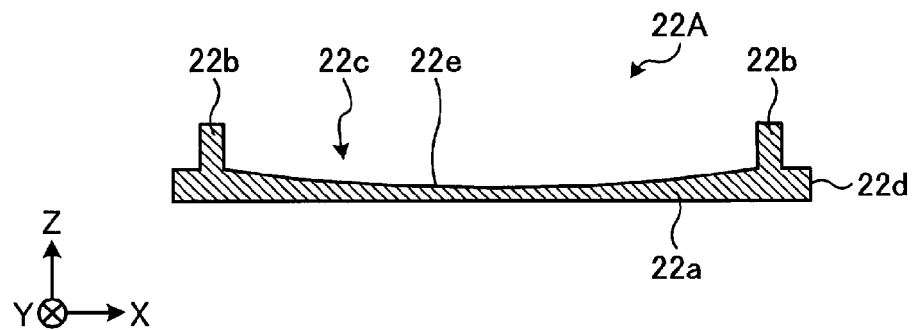
FIG. 9C is a cross-sectional view illustrating another example of the jig according to the exemplary embodiment.

Subsequently, another example of the jig 22 according to the exemplary embodiment will be described with reference to FIG. 9C. FIG. 9C is a cross-sectional view illustrating another example of the jig according to the exemplary embodiment, and is a view corresponding to FIG. 9B.

As illustrated in FIG. 9C, in the jig 22A, a curved recess 22e is formed on the inner surface of the ring-shaped portion 22b on the main surface on the top surface side of the disk portion 22a. The amount of the IPA liquid 71 which may be deposited in the recess 22c may be further increased by forming the recess 22e.

Therefore, the jig 22A may carry the IPA liquid 71 into the drying processing unit 17 in a sufficient amount to fill the IPA gas 72 in the drying processing unit 17.

Further, FIG. 9C illustrates an example of forming a curved recess 22e, but the shape of the recess 22e is not limited to a curved shape. For example, the inner surface of the ring-shaped portion 22b on the main surface of the top surface side of the disk portion 22a may be made generally flat as a flat surface than the outer surface of the ring-shaped portion 22b.

Further, FIG. 2 illustrates an example in which one jig 22 is provided in the substrate processing system 1, but a plurality of jigs 22 may be provided in the substrate processing system 1. Thus, since the cleaning process may be performed in parallel in a plurality of drying processing units 17, so that the drying processing unit 17 may be returned to the drying process of the wafer W at an early stage.

In addition, when the plurality of jigs 22 are provided in the substrate processing system 1 as described above, a plurality of jig placing units 21 may be provided in the transfer section 12 and a carrier capable of mounting the plurality of jigs 22 may be provided in the transfer section 12.

Figure 10:
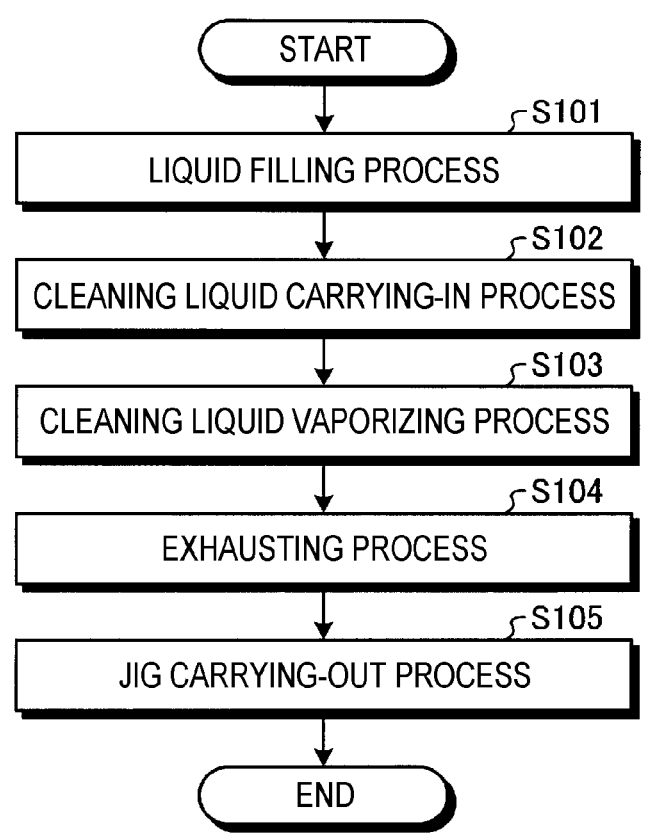
FIG. 10 is a flow chart illustrating a processing procedure in a cleaning process of a substrate processing apparatus according to the exemplary embodiment.

FIG. 10 is a flow chart illustrating a processing procedure in a cleaning process of a substrate processing system 1 according to the exemplary embodiment. Further, the cleaning process of the substrate processing system 1 illustrated in FIG. 10 is executed by reading a program stored in the storage unit 20 of the control device 4 by the controller 19 and controlling, for example, the cleaning processing unit 16 or the drying processing unit 17 based on the read instruction by the controller 19.

As illustrated in FIG. 10, the substrate transfer device 18 (see, e.g., FIG. 2) first carries the jig 22 into the cleaning processing unit 16. The jig 22 is held by the wafer holding mechanism 25 (see, e.g., FIG. 3) in a state where the ring-shaped portion 22b faces upward. Thereafter, the controller 19 controls the cleaning processing unit 16 to perform the liquid filling process of the IPA liquid 71 with respect to the jig 22.

In the liquid filling process, the nozzle arm 26 is first caused to advance into the upper side of the jig 22 held in the wafer holding mechanism 25. Thereafter, a predetermined amount of the IPA liquid 71 is supplied from the chemical liquid nozzle 26a provided at the front end portion of the nozzle arm 26. The predetermined amount is, for example, the IPA gas 72 generated from the IPA liquid 71, which is sufficient to fill the inside of the drying processing unit 17.

Subsequently, the substrate transfer device 18 carries out the jig 22 subjected to the liquid filling process from the cleaning processing unit 16 and performs a cleaning liquid carrying-in process of carrying the jig 22 into the drying processing unit 17 (S102). In the cleaning liquid carrying-in process, the jig 22 subjected to the liquid filling process is first held by the holding plate 32 (see, e.g., FIG. 4). Thereafter, the holding plate 32 and the cover member 33 are housed in the main body 31 together with the jig 22 subjected to the liquid filling process and the opening 34 is hermetically sealed by the cover member 33.

Subsequently, a cleaning liquid vaporizing process is performed in the drying processing unit 17 (S103). In the cleaning liquid vaporizing process, the IPA liquid 71 subjected to the liquid filling process is first vaporized. The vaporizing process is performed by, for example, raising the temperature of the jig 22 or the drying processing unit 17 to about 100° C.

Thereafter, the IPA liquid 72 is filled in the drying processing unit 17, and the IPA gas 72 is caused to stand by for a predetermined time in the filled state. Here, the total time required for the IPA gas 72 to be filled in the drying processing unit 17 and to stand by in that state is, for example, 30 minutes or more. Thus, the IPA gas 72 filled in the drying processing unit 17 adsorbs the particles that are floating and adhering in the drying processing unit 17.

Subsequently, an exhausting process is performed in the drying processing unit 17 (S104). In the exhausting process, the controller 19 controls the valve 52e, the exhaust control valve 59, the valve 52f, and the exhaust control needle valve 61a on the downstream side of the drying processing unit 17 to change the states of the valves from the closed state to the open state. Thus, the IPA gas 72 adsorbing the particles that are floating and adhering in the drying processing unit 17 is exhausted to the outside of the drying processing unit 17.

Thereafter, a jig carrying-out process is performed in the processing unit 17 (S105). In the jig carrying-out process, the valve 52e, the exhaust control valve 59, the valve 52f, and the exhaust control needle valve 61a, which are in the open state, are first changed to the closed state, and then, the inside of the drying processing unit 17 is released to an atmospheric pressure using, for example, the purging device 62.

Thereafter, the jig 22 is carried out from the drying processing unit 17 using the substrate transfer device 18. When the jig carrying-out process is completed, the cleaning process for the drying processing unit 17 is completed.

Further, the processing procedure illustrated in FIG. 10 may be repeatedly performed in a single cleaning process. The number of particles that are floating and adhering in the drying processing unit 17 may be further reduced by repeatedly performing the processing procedure in a single cleaning process.

In the exemplary embodiment described up to here, the jig 22 is subjected to the liquid filling process and the jig 22 is carried into the drying processing unit 17 to perform the cleaning process, but the member to be filled with the liquid is not limited to the jig 22. For example, the IPA liquid 71 may be subjected to the liquid filling process on the surface of the wafer W, and the wafer W subjected to the liquid filling process may be carried into the drying processing unit 17 to perform the cleaning process of the drying processing unit 17.

<Modification>

In the following, various modifications of the cleaning process of the substrate processing system 1 according to the exemplary embodiment will be described. First, Modification 1 of the cleaning process will be described with reference to FIGS. 11A, 11B, and 12.

Figure 11A:
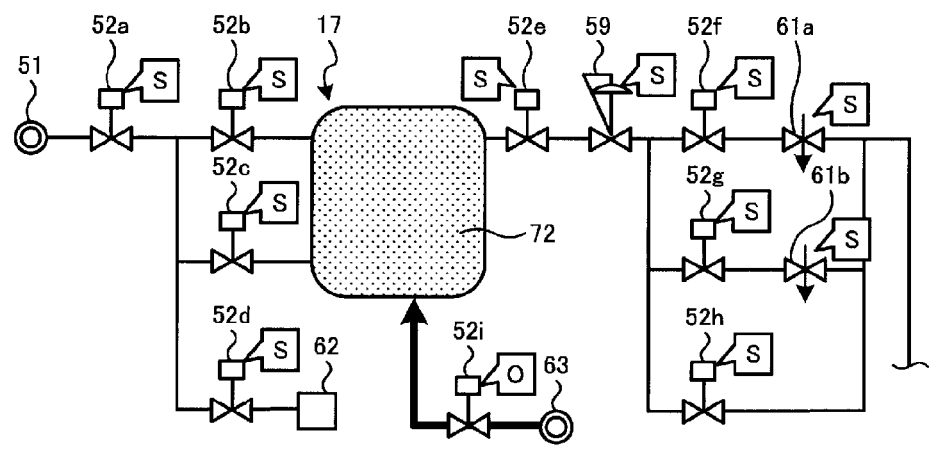
FIG. 11A is a diagram illustrating an outline of a cleaning gas introducing process according to Modification 1 of the exemplary embodiment.

FIG. 11A is a diagram illustrating an outline of a cleaning gas introducing process according to Modification 1 of the exemplary embodiment. As illustrated in FIG. 11A, in Modification 1, the drying processing unit 17 is connected to an IPA gas supply source 63 via a valve 52i. The IPA gas 72 is stored in the IPA gas supply source 63. In addition, the valve 52i may be controlled by the controller 19 of the control device 4 in the same manner as the other valves.

Further, in Modification 1, the IPA gas 72 is introduced into the drying processing unit 17 by the cleaning gas introducing process. Specifically, as illustrated in FIG. 11A, the controller 19 of the control device 4 controls all of the valves 52a to 52h, the exhaust control valve 59, and the exhaust control needle valves 61a and 61b to a closed state, and controls the valve 52i to an open state. By this control, the IPA gas 72 is introduced from the IPA gas supply source 63 into the drying processing unit 17 through the valve 52i.

The IPA gas 72 is filled into the drying processing unit 17 by the cleaning gas introducing process to cause the IPA gas 72 to be filled in the drying processing unit 17. Then, the IPA gas filled in the drying processing unit 17 adsorbs the particles that are floating and adhering in the drying processing unit 17 by the above-described cleaning gas introducing process.

That is, the cleaning gas introducing process in Modification 1 corresponds to the cleaning liquid vaporizing process in the exemplary embodiment. Therefore, the same conditions as those for the cleaning liquid vaporizing process in the exemplary embodiment may be used for, for example, the time for performing the cleaning gas introducing process.

Figure 11B:
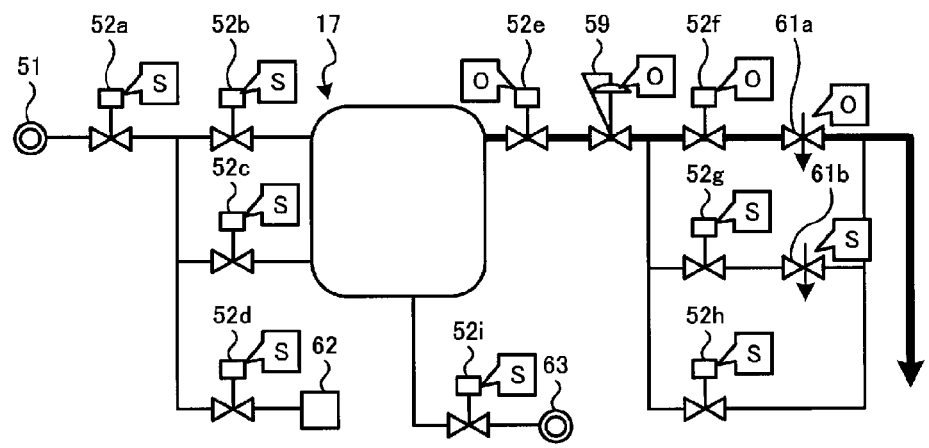
FIG. 11B is a diagram illustrating an outline of an exhausting process according to Modification 1 of the exemplary embodiment.

In Modification 1, the exhausting process is performed following the cleaning gas introducing process. FIG. 11B is a diagram illustrating an outline of an exhausting process according to Modification 1 of the exemplary embodiment.

In the exhausting process, as illustrated in FIG. 11B, the controller 19 of the control device 4 changes the valve 52i from the open state to the closed state and also changes the valve 52e, the exhaust control valve 59, the valve 52f, and the exhaust control needle valve 61a, which are on the downstream side of the drying processing unit 17, from the closed state to the open state.

Thus, the IPA gas 72 adsorbing the particles that are floating and adhering in the drying processing unit 17 is exhausted to the outside of the drying processing unit 17. Therefore, the floating and adhering particles in the drying processing unit 17 may be removed together with the IPA gas 72.

That is, the exhausting process in Modification 1 corresponds to the exhausting process in the exemplary embodiment. Therefore, various conditions of the exhausting process in Modification 1 may be the same as those of the exhausting process in the exemplary embodiment.

In Modification 1, the IPA gas 72 may be filled in the drying processing unit 17 without performing the liquid filling process or carrying-in process of the jig 22. That is, the time required for the cleaning process of the drying processing unit 17 may be reduced because the liquid filling process or carrying-in process of the jig 22 may be omitted. Therefore, according to Modification 1, the drying processing unit 17 may be returned back to the drying process of the wafer W at an early stage.

Figure 12:
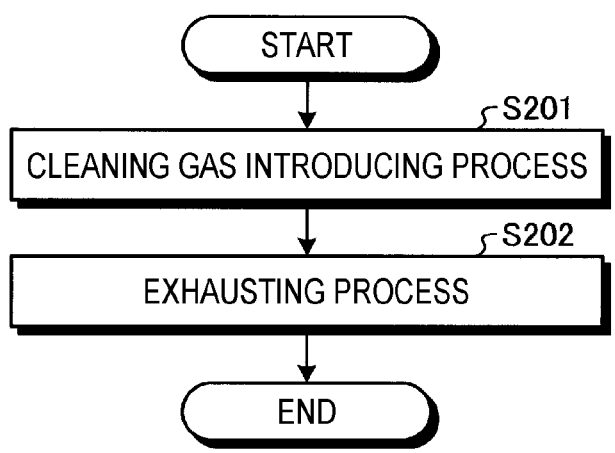
FIG. 12 is a flow chart illustrating a processing procedure in a cleaning process of a substrate processing system according to Modification 1 of the exemplary embodiment.

FIG. 12 is a flow chart illustrating a processing procedure in the cleaning process of the substrate processing system 1 according to Modification 1 of the exemplary embodiment.

As illustrated in FIG. 12, the cleaning gas introducing process is first performed in the drying processing unit 17 (S201). In the cleaning gas introducing process, the controller 19 first controls all of the valves 52a to 52h, the exhaust control valve 59, and the exhaust control needle valves 61a and 61b to the closed state. Thereafter, the controller 19 controls the valve 52i to the open state so as to introduce the IPA gas 72 into the drying processing unit 17 from the IPA gas supply source 63 via the valve 52i.

Thereafter, the IPA liquid 72 is filled in the drying processing unit 17, and the IPA gas 72 is caused to stand by for a predetermined time in the filled state. Here, the total time required for the IPA gas 72 to be filled in the drying processing unit 17 and to stand by in that state is, for example, 30 minutes or more. Thus, the IPA gas 72 filled in the drying processing unit 17 adsorbs the particles that are floating and adhering in the drying processing unit 17.

At this time, the valve 52i may be kept open or the valve 52i may be changed to the closed state after a predetermined amount of the IPA gas 72 is introduced.

Further, when the IPA gas 72 is introduced into the drying processing unit 17, the present disclosure is not limited thereto. For example, the valves 52a and 52f, the exhaust control valve 59, and the exhaust control needle valve 61a may be controlled to the open state for the first few seconds and the valve 52i may be controlled to the open state so as to introduce the IPA gas 72 into the drying processing unit 17 from the IPA gas supply source 63 via the valve 52i. Thereafter, the valves 52a and 52f, the exhaust control valve 59, and the exhaust control needle valve 61a may be controlled to the closed state and then, the IPA gas 72 may be introduced into the drying processing unit 17 from the IPA gas supply source 63 via the valve 52i. Thus, the time for introducing IPA gas 72 into the drying processing unit 17 may be reduced.

Subsequently, an exhausting process is performed in the drying processing unit 17 (S202). In the exhausting process, the controller 19 controls the valve 52i to a closed state. Thereafter, the controller 19 controls the valve 52e, the exhaust control valve 59, the valve 52f, and the exhaust control needle valve 61a on the downstream side of the drying processing unit 17 to change the states of the above-described valves from closed states to open states. Thus, the IPA gas 72 adsorbing the particles that are floating and adhering in the drying processing unit 17 is exhausted to the outside of the drying processing unit 17.

Thereafter, when the valve 52e, the exhaust control valve 59, the valve 52f, and the exhaust control needle valve 61a, which are in the open state, are changed to the closed state, the cleaning process according to Modification 1 is completed.

Subsequently, Modification 2 of the cleaning process will be described with reference to FIGS. 13A to 13C and 14.

Figure 13A:
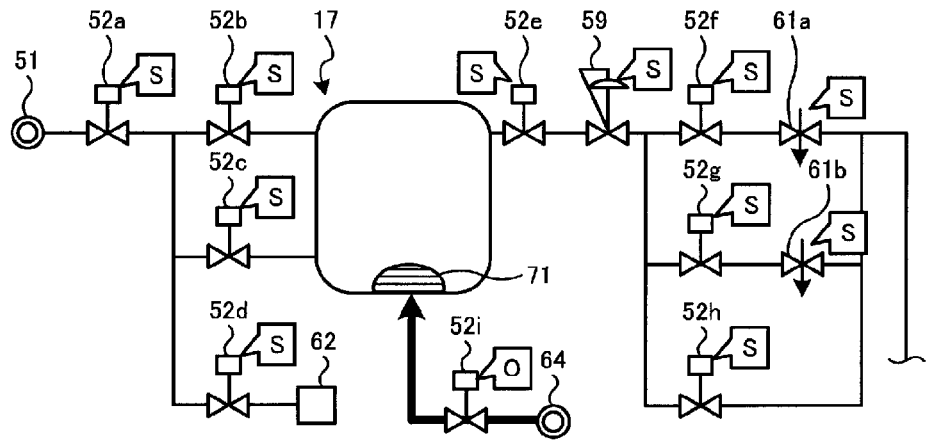
FIG. 13A is a diagram illustrating an outline of a cleaning gas introducing process according to Modification 2 of the exemplary embodiment.

FIG. 13A is a diagram illustrating an outline of the cleaning liquid introducing process according to Modification 2 of the exemplary embodiment. As illustrated in FIG. 13A, in Modification 2, the drying processing unit 17 is connected to an IPA gas supply source 64 via the valve 52i. The IPA gas 71 is stored in the IPA gas supply source 64. In addition, the valve 52i may be controlled by the controller 19 of the control device 4 in the same manner as other valves.

Further, in Modification 2, the IPA liquid 71 is introduced into the drying processing unit 17 by a cleaning liquid introducing process. Specifically, as illustrated in FIG. 13A, the controller 19 of the control device 4 controls all of the valves 52a to 52h, the exhaust control valve 59, and the exhaust control needle valves 61a and 61b to the closed state, and controls the valve 52i to the open state. By this control, the IPA liquid 71 is introduced from the IPA gas supply source 64 into the drying processing unit 17 through the valve 52i.

That is, the cleaning liquid introducing process in Modification 2 corresponds to the liquid filling process and the cleaning liquid carrying-in process in the exemplary embodiment. Therefore, for example, the amount of the IPA liquid 71 to be introduced in the cleaning liquid introducing process may be the same as the conditions of the liquid filling process and the cleaning liquid carrying-in process in the exemplary embodiment.

Figure 13B:
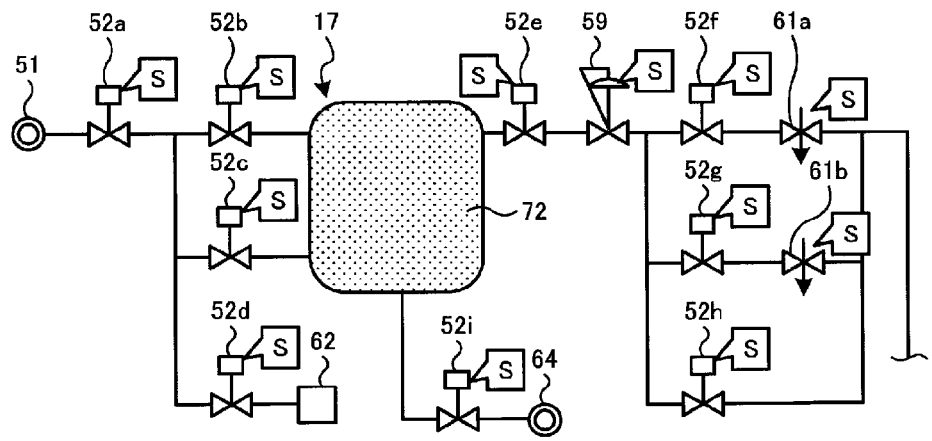
FIG. 13B is a diagram illustrating an outline of a cleaning gas vaporizing process according to Modification 2 of the exemplary embodiment.

In Modification 2, the cleaning liquid vaporizing process is performed following the cleaning liquid introducing process. FIG. 13B is a diagram illustrating an outline of a cleaning liquid vaporizing process according to Modification 2 of the exemplary embodiment.

As illustrated in FIG. 13B, in the cleaning liquid vaporizing process, the controller 19 of the control device 4 changes the valve 52i from the open state to the closed state and vaporizes (evaporates) the IPA liquid 71 introduced into the drying processing unit 17. Then, the IPA gas 72 generated by the vaporization is filled in the drying processing unit 17. Thus, the IPA gas 72 is filled in the drying processing unit 17.

Then, the IPA gas 72 filled in the drying processing unit 17 adsorbs the particles that are floating and adhering in the drying processing unit 17 by the above-described cleaning liquid vaporizing process. That is, the cleaning liquid vaporizing process in Modification 2 corresponds to the cleaning liquid vaporizing process in the exemplary embodiment. Therefore, various conditions of the cleaning gas introducing process in Modification 2 may be the same as those of the cleaning liquid vaporizing process in the exemplary embodiment.

Figure 13C:
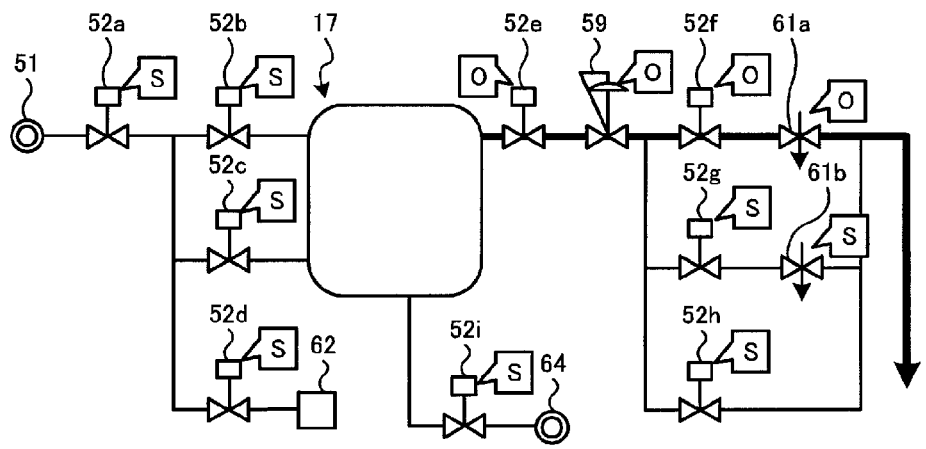
FIG. 13C is a diagram illustrating an outline of an exhausting process according to Modification 2 of the exemplary embodiment.

In Modification 2, the exhausting process is performed following the cleaning liquid vaporizing process. FIG. 13C is a diagram illustrating an outline of the exhausting process according to Modification 2 of the exemplary embodiment.

In the exhausting process, the controller 19 of the control device 4 changes the valve 52e, the exhaust control valve 59, the valve 52f, and the exhaust control needle valve 61a on the downstream side of the drying processing unit 17 from the closed state to the open state, as illustrated in FIG. 13C.

Thus, the IPA gas 72 adsorbing the floating and adhering particles in the drying processing unit 17 is exhausted to the outside of the drying processing unit 17. Therefore, the floating and adhering particles in the drying processing unit 17 may be removed together with the IPA gas 72.

That is, the exhausting process in Modification 2 corresponds to the exhausting process in the exemplary embodiment. Therefore, various conditions of the exhausting process in Modification 2 may be the same as those of the exhausting process in the exemplary embodiment.

In Modification 2, the IPA liquid 71 may be introduced into the drying processing unit 17 without performing a carrying-in process of the jig 22. That is, the time required for the cleaning process of the drying processing unit 17 may be reduced because the carrying-in process of the jig 22 may be omitted. Therefore, according to Modification 2, the drying processing unit 17 may be returned back to the drying process of the wafer W at an early stage.

Figure 14:
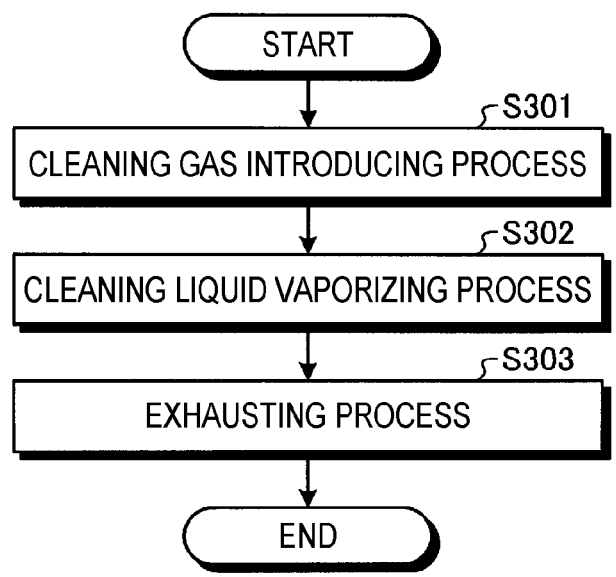
FIG. 14 is a flow chart illustrating a processing procedure in a cleaning process of a substrate processing system according to Modification 2 of the exemplary embodiment.

FIG. 14 is a flow chart illustrating a processing procedure in the cleaning process of the substrate processing system 1 according to Modification 2 of the exemplary embodiment.

As illustrated in FIG. 14, the cleaning liquid introducing process is first performed in the drying processing unit 17 (S301). In the cleaning liquid introducing process, all of the valves 52a to 52h, the exhaust control valve 59, and the exhaust control needle valves 61a and 61b are controlled to the closed state.

Thereafter, the controller 19 controls the valve 52i to the open state to introduce a predetermined amount of the IPA liquid 71 into the drying processing unit 17 from the IPA liquid supply source 64 via the valve 52i. The predetermined amount is, for example, the IPA gas 72 generated from the IPA liquid 71, which is sufficient to fill the inside of the drying processing unit 17.

Subsequently, a cleaning liquid vaporizing process is performed in the drying processing unit 17 (S302). In the cleaning liquid vaporizing process, the IPA gas 71 introduced into the drying processing unit 17 is first vaporized. The vaporizing process is performed by, for example, raising the temperature of the main body of the drying processing unit 17 to about 100° C.

Thereafter, the IPA liquid 72 is filled in the drying processing unit 17, and the IPA gas 72 is caused to stand by for a predetermined time in the filled state. Here, the total time required for the IPA gas 72 to be filled in the drying processing unit 17 and to stand by in that state is, for example, 30 minutes or more. Thus, the IPA gas 72 filled in the drying processing unit 17 adsorbs the particles that are floating and adhering in the drying processing unit 17.

Further, in the cleaning liquid introducing process, the valve 52*i* may be changed to the closed state after a predetermined amount of the IPA liquid 71 is introduced, and the open state of the valve 52*i* may be maintained from the cleaning liquid introducing process to the cleaning liquid vaporizing process.

Subsequently, an exhausting process is performed in the drying processing unit 17 (S303). In the exhausting process, the controller 19 controls the valve 52*i* to the closed state. Thereafter, the controller 19 controls the valve 52*e*, the exhaust control valve 59, the valve 52*f*, and the exhaust control needle valve 61*a* on the downstream side of the drying processing unit 17 to change the states of the above-described valves from the closed state to the open state. Thus, the IPA gas 72 adsorbing the particles that are floating and adhering in the drying processing unit 17 is exhausted to the outside of the drying processing unit 17.

Thereafter, when the valve 52*e*, the exhaust control valve 59, the valve 52*f*, and the exhaust control needle valve 61*a*, which are in the open state, are changed to the closed state, the cleaning process according to Modification 2 is completed.

Example

The cleaning process of the substrate processing system 1 according to the exemplary embodiment was specifically performed.

First, in the substrate processing system 1 in which a drying process using the $CO_2$ supercritical fluid 70 was repeatedly performed, the number of particles adhering to the wafer W subjected to the cleaning process immediately before the drying process was measured by a particle counter, and 19,310 particles having a size of 30 nm or more were measured.

Next, in the substrate processing system 1, the cleaning process according to the exemplary embodiment was performed. In the cleaning process, in the cleaning liquid vaporizing process, the temperature of the main body 31 of the drying processing unit 31 was maintained at about 100° C., which was raised in the immediately preceding drying process, and the cleaning liquid vaporizing process was performed for about three minutes. Then, the processing procedure in the cleaning process illustrated in FIG. 10 was repeatedly performed, and the cleaning process was performed for about 3 hours in total.

Next, immediately after the above-described cleaning process was performed, the drying process using the $CO_2$ supercritical fluid 70 was performed on the wafer W, and the number of particles adhering to the wafer W was measured by a particle counter and 2,533 particles having a size of 30 nm or more were measured.

As described above, it can be seen that the cleaning process of the substrate processing system 1 according to the exemplary embodiment may reduce the number of particles adhering to the wafer W by comparing the number of particles adhering to the wafer W immediately before the cleaning process and immediately after the cleaning process.

The substrate processing apparatus cleaning method according to the exemplary embodiment is a method of cleaning the substrate processing apparatus (drying processing unit 17) in which a substrate (wafer W) in a state in which the surface is wet by a liquid is brought into contact with the supercritical fluid 70 so as to perform a drying process (S1) that dries a substrate (wafer W). The substrate processing apparatus cleaning method includes: a cleaning gas filling process (S3); and a cleaning gas exhausting process (S4). In the cleaning gas filling process (S3), a cleaning gas (IPA gas 72) containing isopropyl alcohol is filled in the substrate processing apparatus (drying processing unit 17). In the exhausting process (S4), the cleaning gas (IPA gas 72) is exhausted from the inside of the substrate processing apparatus (drying processing unit 17) after the cleaning gas filling process (S3). Thus, a large number of particles to the wafer W may be suppressed from adhering when the wafer W is dried using the supercritical fluid 70.

Further, in the substrate processing apparatus cleaning method according to the exemplary embodiment, the liquid contains isopropyl alcohol. Therefore, the drying process of the wafer W may be stably performed.

Further, in the substrate processing apparatus cleaning method according to the exemplary embodiment, the cleaning gas filling process (S3) includes: a cleaning liquid carrying-in process (S102) of carrying the jig 22 (22A) in which the cleaning liquid (IPA liquid 71) containing isopropyl alcohol is deposited into the substrate processing apparatus (drying processing unit 17); and a cleaning liquid vaporizing process (S103) of vaporizing the cleaning liquid (IPA liquid 71) inside the substrate processing apparatus (drying processing unit 17) after the cleaning liquid carrying-in process (S102). Thus, the cleaning process of the substrate processing system 1 may be performed at a low cost.

Further, in the substrate processing apparatus cleaning method according to the exemplary embodiment, the jig 22 (22A) includes a disk portion 22*a* having a diameter and a thickness substantially equal to those of the substrate (wafer W), and a ring-shaped portion 22*b* protruding in a ring shape from the main surface of the disk portion 22*a*. Therefore, the IPA liquid 71 in a sufficient amount to fill the IPA gas 72 in the drying processing unit 72 may be carried into the drying processing unit 17.

Further, in the substrate processing apparatus cleaning method according to the exemplary embodiment, the filling of the cleaning gas (S3) includes a cleaning gas introducing process (S201) of introducing the cleaning gas (IPA gas 72) into the substrate processing apparatus (drying processing unit 17) through a predetermined introduction path. Thus, the substrate processing system 1 may be returned to the drying process (S1) of the wafer W at an early stage.

Further, in the substrate processing apparatus cleaning method according to the exemplary embodiment, the filling of the cleaning gas (S3) includes: a cleaning liquid introducing process (S301) of introducing the cleaning liquid (IPA liquid 71) containing isopropyl alcohol into the substrate processing apparatus (drying processing unit 17) through the predetermined introduction path; and a cleaning liquid vaporizing process (S302) of vaporizing the cleaning liquid (IPA liquid 71) inside the substrate processing apparatus (drying processing unit 17) after the cleaning liquid introducing process (S301). Thus, the substrate processing system 1 may be returned to the drying process (S1) of the wafer W at an early stage.

Further, in the substrate processing apparatus cleaning method according to the exemplary embodiment, the supercritical fluid 70 is a supercritical fluid containing carbon dioxide. Thus, the surface of a wafer W may be dried while suppressing the occurrence of pattern collapse in the wafer W.

Further, the substrate processing apparatus cleaning system according to the exemplary embodiment is a system of cleaning the substrate processing apparatus (drying processing unit 17) in which the substrate (wafer W) in a state in which the surface is wet by a liquid is brought into contact with the supercritical fluid 70 to perform a drying process of drying a substrate (wafer W). The cleaning system includes a cleaning gas filling section and an exhausting unit. The cleaning gas filling unit fills the cleaning gas (IPA gas 72) containing isopropyl alcohol in the substrate processing apparatus (drying processing unit 17). The exhausting unit exhausts the cleaning gas (IPA gas 72) from the inside of the substrate processing apparatus (drying processing unit 17). Thus, a large number of particles may be suppressed from adhering to the wafer W when the wafer W is dried using the supercritical fluid 70.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of cleaning a substrate processing apparatus comprising:
   carrying a substrate into a chamber of the substrate processing apparatus with a substrate holder;
   drying the substrate having a surface wet by a cleaning liquid brought into contact with a supercritical fluid in the chamber of the substrate processing apparatus;
   a first vaporizing to vaporize the supercritical fluid into a supercritical gas;
   a first exhausting to remove the supercritical gas from an inside of the chamber of the substrate processing apparatus;
   carrying a jig only filled with the cleaning liquid into the chamber of the substrate processing apparatus with the substrate holder via a disc portion of the jig, the disc portion of the jig being configured to be held by the substrate holder by having a diameter and a thickness substantially equal to a diameter and a thickness of the substrate and the cleaning liquid being held in a ring-shaped portion of the jig protruding in a ring shape from a main surface of the disk portion;
   a second vaporizing to vaporize the cleaning liquid on the jig into a cleaning gas within the chamber of the substrate processing apparatus after the carrying;
   filling the inside of the chamber of the substrate processing apparatus with the cleaning gas; and
   a second exhausting to remove the cleaning gas formed in the second vaporizing from the inside of the chamber of the substrate processing apparatus after the filling and after a predetermined time.

2. The method of claim 1, wherein the cleaning liquid contains isopropyl alcohol.

3. The method of claim 1, wherein the supercritical fluid contains carbon dioxide.

4. A system for cleaning a substrate processing apparatus comprising:
   a memory; and
   a processor coupled to the memory and configured to:
      carry a substrate into a chamber of the substrate processing apparatus with a substrate holder;
      dry the substrate having a surface wet by a cleaning liquid brought into contact with a supercritical fluid in the chamber of the substrate processing apparatus;
      first vaporize the supercritical fluid into a supercritical gas;
      first exhaust the supercritical gas from an inside of the chamber of the substrate processing apparatus;
      carry a jig only filled with the cleaning liquid containing isopropyl alcohol into the chamber of the substrate processing apparatus with the substrate holder;
      second vaporize the cleaning liquid into a cleaning gas containing isopropyl alcohol within the chamber of the substrate processing apparatus after the jig is carried;
      fill the inside of the chamber of the substrate processing apparatus with the cleaning gas; and
      second exhaust the cleaning gas formed in the second vaporize from the inside of the chamber of the substrate processing apparatus after a predetermined time,
   wherein the jig includes:
      a disk portion configured to be held by the substrate holder by having a diameter and a thickness substantially equal to a diameter and a thickness of the substrate; and
      a ring-shaped portion protruding in a ring shape from a main surface of the disk portion.

5. The method of claim 1, wherein the cleaning gas filling the inside of the chamber of the substrate processing apparatus is configured to absorb particles that are floating in and adhering to the chamber of the substrate processing apparatus as a result of the drying.

6. The method of claim 1 further comprising:
   filling the jig with the cleaning liquid outside the chamber of the substrate processing apparatus prior to the carrying of the jig into the chamber of the substrate processing apparatus.

7. The method of claim 1, wherein a time for the vaporizing is longer than a time for the drying.

* * * * *